(12) United States Patent
Inokuchi et al.

(10) Patent No.: US 6,217,663 B1
(45) Date of Patent: Apr. 17, 2001

(54) SUBSTRATE PROCESSING APPARATUS AND SUBSTRATE PROCESSING METHOD

(75) Inventors: Yasuhiro Inokuchi; Fumihide Ikeda, both of Tokyo; Michiko Nishiwaki, Hamura; Masatoshi Takada; Mamoru Sueyoshi, both of Tokyo, all of (JP)

(73) Assignee: Kokusai Electric Co., Ltd., Tokyo (JP)

( * ) Notice: Subject to any disclaimer, the term of this patent is extended or adjusted under 35 U.S.C. 154(b) by 0 days.

(21) Appl. No.: 08/879,932

(22) Filed: Jun. 20, 1997

(30) Foreign Application Priority Data

Jun. 21, 1996 (JP) .................................................. 8-181394
Aug. 29, 1996 (JP) .................................................. 8-247001

(51) Int. Cl.[7] .................................................. C23C 16/00
(52) U.S. Cl. ............................ 118/728; 118/719; 118/500
(58) Field of Search ........................ 118/725, 726, 118/728, 729, 730, 500, 719, 733, 731, 715; 156/345

(56) References Cited

U.S. PATENT DOCUMENTS

| | | | |
|---|---|---|---|
| 4,542,712 | * 9/1985 | Sato et al. ............................ | 118/728 |
| 5,288,379 | * 2/1994 | Namiki et al. ........................ | 118/719 |
| 5,474,612 | 12/1995 | Sato et al. . | |
| 5,527,393 | 6/1996 | Sato et al. . | |
| 5,766,360 | * 6/1998 | Sato et al. ............................ | 118/719 |
| 5,837,058 | * 10/1998 | Chen et al. ........................... | 118/725 |

* cited by examiner

Primary Examiner—Shrive Beck
Assistant Examiner—P. Hassanzadeh

(57) ABSTRACT

A substrate processing apparatus comprises a hot-wall type processing chamber for processing a substrate, a heater capable of heating an interior of the processing chamber, a substrate holder capable of holding the substrate and processing the substrate in the processing chamber in a state where the substrate holder holds the substrate, and a mechanism, which is capable of allowing the substrate holder to hold the substrate and then transferring the substrate holder holding the substrate into the processing chamber, and/or which is capable of carrying out the substrate holder from the processing chamber in a state where the substrate holder holds the substrate, and then separating the substrate from the substrate holder.

58 Claims, 30 Drawing Sheets

FIG. 8 A
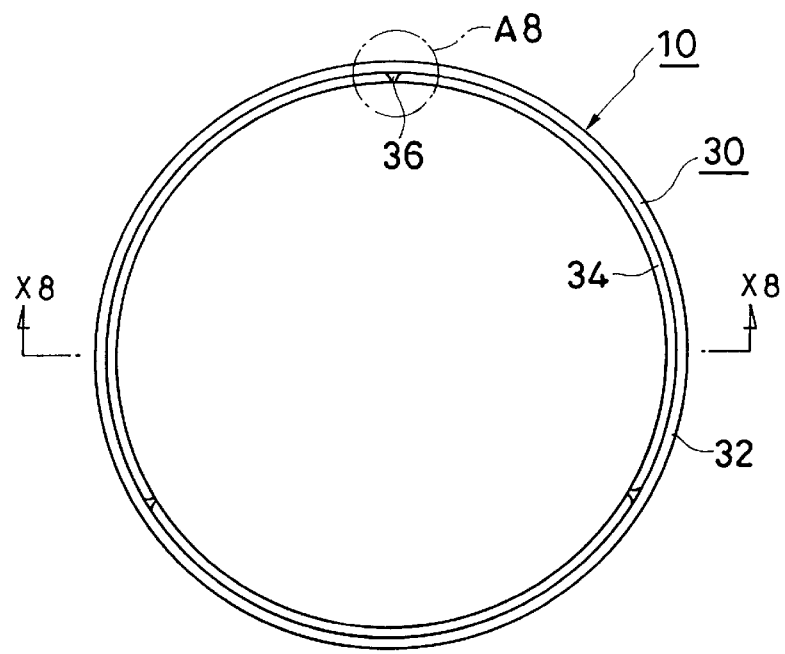
FIG. 8 B
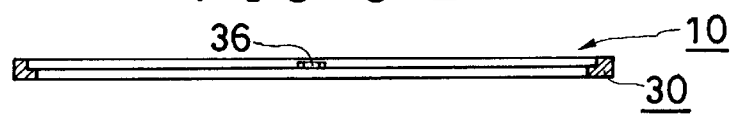
FIG. 8 C
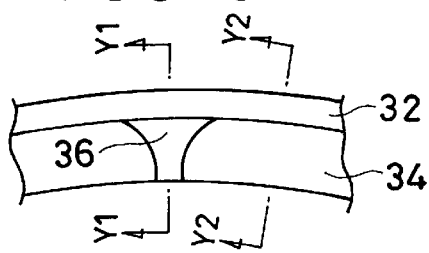
FIG. 8 D             FIG. 8 E
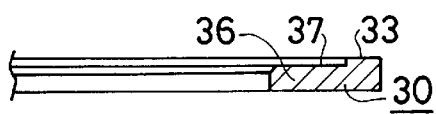  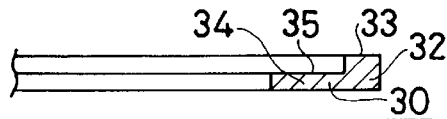

CONVENTIONAL ART

1000°C

1050°C

1100°C

CONVENTIONAL ART

SUBSTRATE PROCESSING APPARATUS AND SUBSTRATE PROCESSING METHOD

BACKGROUND OF THE INVENTION

1. Field of the Invention

The present invention relates to a substrate processing apparatus and a substrate processing method, and more particularly, to a semiconductor wafer processing apparatus and a semiconductor wafer processing method in a single wafer-processing manner or a small number of (particularly, two) wafers-processing manner at a time.

2. Description of the Related Art

In a processing chamber for conducting a semiconductor wafer processing in a semiconductor wafer processing apparatus which processes a single wafer or a small number of wafers at a time, in order to increase the throughput, a temperature is not usually risen or lowered for each process, and in many cases, the temperature is kept at a predetermined high value.

FIGS. 37 and 38 are perspective views for explaining a conventional semiconductor wafer processing apparatus which loads and unloads the semiconductor wafer into and from the processing chamber which is kept at a high temperature.

In the processing chamber (not shown), a plate 110 for mounting a semiconductor wafer is provided beforehand. When the processing of the semiconductor wafer 100 is conducted, the semiconductor wafer 100 is directly mounted on an arm 122 of a tweezer 120 and is transferred into the processing chamber (not shown). Then, semiconductor wafer 100 is directly mounted on a supporting claw 116 provided in a space 112 of the plate 110 to conduct the processing. After the processing is completed in the processing chamber, the tweezer 120 is inserted into the space 112 of the plate 110 from the side of a space 114 of the plate 110 to put the semiconductor wafer 100 directly onto the arm 122 of the tweezer 120 to transfer the semiconductor wafer 100 out of the processing chamber.

FIGS. 39A, 39B and 39C show results of slips generated in the semiconductor wafer 100 when the semiconductor wafer 100 is processed by using such a conventional technique under a condition in which a P⁻<100> wafer having a diameter of 8 inches is used, $N_2$ is flowed at 10 liters per minute, the processing time is 5 minutes, the processing temperature is set at 1000° C., 1050° C. and 1100° C., respectively, and a preheating time of the tweezer is 30 seconds. The measurement was conducted under a microscope with a magnification of 50. As a result, it was found that a slip was generated especially around an outer peripheral portion of the semiconductor wafer 100.

In the conventional technique, there is a problem that a slip is generated in the semiconductor wafer as described above.

SUMMARY OF THE INVENTION

Therefore, a major object of the present invention is to provide a substrate processing apparatus and a substrate processing method which can restrain a defect such as a slip and an nonuniformity of processing from being generated in or on a substrate.

The present inventors found out after hard study that in the conventional technique, because the semiconductor wafer 100 is directly mounted on the arm 122 of the tweezer 120 when the semiconductor wafer 100 is loaded or unloaded into or from the high-temperature processing chamber, a slip is generated in the semiconductor wafer 100 for the following reasons:

(1) When the semiconductor wafer 100 is unloaded from the high-temperature processing chamber, because the high-temperature semiconductor wafer 100 is picked up by the arm 122 of the low-temperature tweezer 120, a portion of the semiconductor wafer 100 which is contacted with the arm 122 is locally cooled and a slip is generated.

(2) The tweezer 120 is under restrictions such as one in which the tweezer 120 needs to have an access to a wafer cassette and thus, the tweezer 120 can not support the semiconductor wafer 100 at supporting points disposed at a uniform intervals from one another. Therefore, an nonuniform weight stress of the semiconductor wafer 100 itself is generated and a slip is generated.

FIG. 40A is a plan view for explaining a relationship of positions of the wafer transfer tweezer, the semiconductor wafer and a cassette, and FIG. 40B is a sectional view taken along the line X40—X40 in FIG. 40A.

A wafer supporting portion 420 of a wafer cassette 410 is located at a peripheral portion of the semiconductor wafer 100, and in order to take the semiconductor wafer 100 out of or into the wafer cassette 410, the tweezer 120 is required to be formed into a shape as shown in FIG. 40A such that the tweezer 120 can be inserted into a central portion of the wafer cassette 410. Further, in order to reduce a contact area of the tweezer 120 with the semiconductor wafer 100, the arm 122 of the tweezer 120 is provided with recesses 124 and 126 so that the semiconductor wafer 100 can be supported at four points (C1, C2, C3 and C4). Therefore, the semiconductor wafer 100 can not be supported at uniform load only by the tweezer 120 and the self-weight of the wafer is applied to the wafer itself and as a result, a slip is generated.

(3) In a heat-up process after the semiconductor wafer 100 is loaded into the high-temperature processing chamber, temperature rise around an outer peripheral portion of the wafer is faster than the central portion of the wafer and therefore, a difference in temperature is generated over the entire surface of the semiconductor wafer 100. As a result, a warpage or a slip is generated.

(4) In a heat-down process after the semiconductor wafer 100 is unloaded from the high-temperature processing chamber, temperature fall around an outer peripheral portion of the wafer is faster than the central portion of the wafer and therefore, a slip is generated as in the above mentioned reason (3).

As described above, in the conventional technique, a slip is generated in the semiconductor wafer 100 by a relationship between a yield shear stress, and 1) a thermal stress due to a difference in temperature within the wafer as well as 2) a self-weight stress due to an nonuniform load support of the wafer.

According to a first aspect of the present invention, there is provided a substrate processing apparatus, comprising:

a processing chamber for processing a substrate;

heating means capable of heating an interior of the processing chamber;

a substrate holding member capable of holding the substrate, and capable of processing the substrate in the processing chamber in a state where the substrate holding member holds the substrate; and a mechanism, which is capable of allowing the substrate holding member to hold the substrate and then transferring the substrate holding member holding the substrate into the processing chamber, and/or which is capable of carrying out the substrate holding member from the processing chamber in a state where the substrate holding member holds the substrate, and then separating the substrate from the substrate holding member.

According to a second aspect of the present invention, there is provided a substrate processing apparatus, comprising:

a hot-wall type processing chamber for processing a substrate;

a heater capable of heating an interior of the processing chamber;

a substrate holding member capable of holding the substrate, and capable of processing the substrate in the processing chamber in a state where the substrate holding member holds the substrate; and a mechanism, which is capable of transferring the substrate holding member, in a state where the substrate holding member holds the substrate, into the processing chamber which is heated, and/or which is capable of carrying out the substrate holding member, in a state where the substrate holding member holds the substrate, from the heated processing chamber.

According to a third aspect of the present invention, there is provided a substrate processing method, comprising the steps of:

transferring a substrate holding member holding a substrate into a hot-wall type processing chamber which is kept at a predetermined temperature;

then, processing the substrate in a state where the substrate is held by the substrate holding member in the processing chamber; and then, carrying out the substrate holding member holding the substrate from the processing chamber.

In the column of "WHAT IS CLAIMED IS", there exist expressions such as "something and something being (or are) capable of performing a relative movement in a vertical direction with respect to each other". For example, in the case of a sentence that first and second members can relatively move in a vertical direction with respect to each other, this is intended to mean both a case in which either one of the first and second members can move in a vertical direction while the other member is fixed, and a case in which both the first and second members can move in a vertical direction.

Further, in the column of "WHAT IS CLAIMED IS", there exist expressions such as "something is (or being) relatively moved upward (or downward) with respect to something" and "by relatively moving something upward (or downward) with respect to something". For example, in the case of a sentence that a first member is relatively moved upward (or downward) with respect to a second member, this is intended to means three cases, i.e., 1) a case in which the second member is fixed and the first member is moved upward (or downward), 2) a case in which the first member is fixed and the second member is moved downward (or upward), and 3) the first member is moved upward (or downward) and the second member is moved downward (or upward).

BRIEF DESCRIPTION OF THE DRAWINGS

The above and further objects, features and advantages of the present invention will become more apparent from the following detailed description taken in conjunction with the accompanying drawings, wherein:

FIG. 8A is a plan view for explaining a wafer holding member used in a semiconductor wafer processing apparatus according to a second embodiment of the present invention, FIG. 8B is a sectional view taken along the line X8—X8 in FIG. 8A, FIG. 8C is a partially enlarged plan view of the portion A8 in FIG. 8A, FIG. 8D is a sectional view taken along the line Y1—Y1 in FIG. 8C, and FIG. 8E is a sectional view taken along the line Y2—Y2 in FIG. 8C;

FIGS. 22A and 22B are illustrations for explaining one example of a rack used in the semiconductor wafer processing apparatus according to the tenth embodiment of the present invention, wherein FIG. 22A is a partially enlarged plan view of the portion A21 in FIG. 21, and FIG. 22B is a vertical sectional view taken along the line X22—X22 in FIG. 22A;

FIGS. 23A and 23B are illustrations for explaining another example of the rack used in the semiconductor wafer processing apparatus according to the tenth embodiment, wherein FIG. 23A is a partially enlarged plan view of a portion corresponding to the portion A21 in FIG. 21, and FIG. 23B is a vertical sectional view taken along the line X23—X23 in FIG. 23A;

FIGS. 28A and 28B are illustrations for explaining a semiconductor wafer processing apparatus according to a twelfth embodiment of the present invention, wherein FIG. 28A is a transverse sectional view taken along the line Y28—Y28 in FIG. 28B, and FIG. 28B is a vertical sectional view taken along the line X28—X28 in FIG. 28A;

FIGS. 40A and 40B are illustrations for explaining a relationship of positions of a wafer transfer tweezer, a semiconductor wafer and a cassette, wherein FIG. 40A is a plan view, and FIG. 40B is a sectional view taken along the line X40—X40 in FIG. 40A.

DESCRIPTION OF THE PREFERRED EMBODIMENTS

First Embodiment

Figure 1:
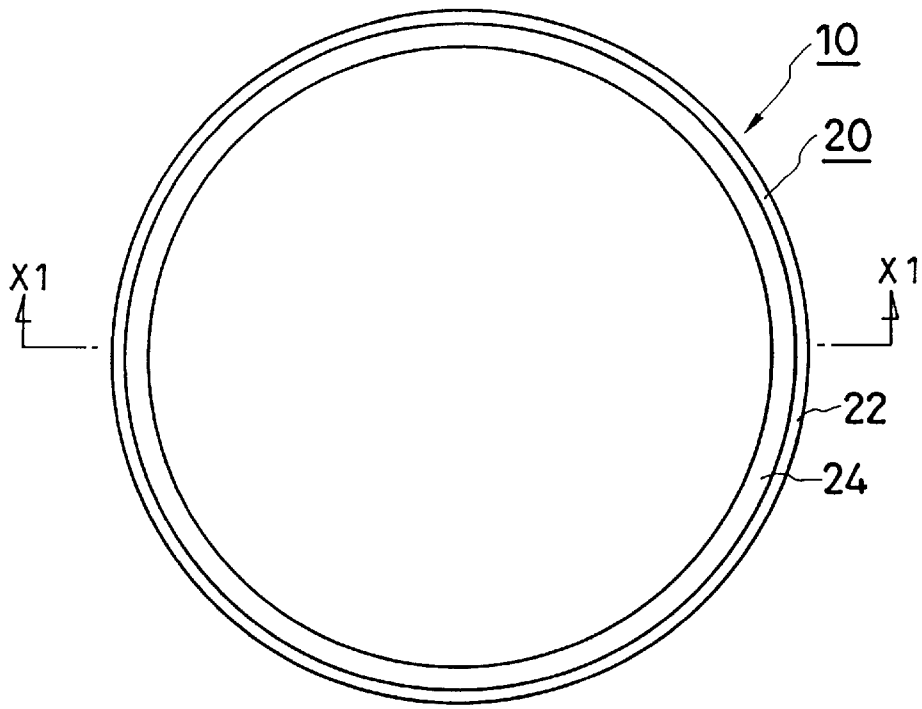
FIG. 1A is a plan view for explaining a wafer holding member used in a semiconductor wafer processing apparatus according to a first embodiment of the present invention.
FIG. 1B is a sectional view taken along the line X1—X1 in FIG. 1A.
FIG. 1C is a partially enlarged sectional view of the portion A1 in FIG. 1B.
Figure 1:
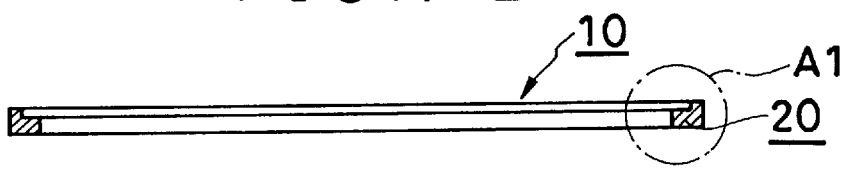
Figure 1:
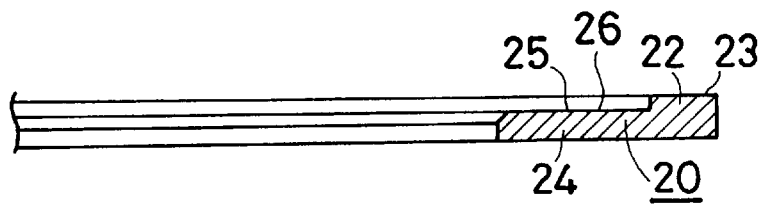
Figure 2:
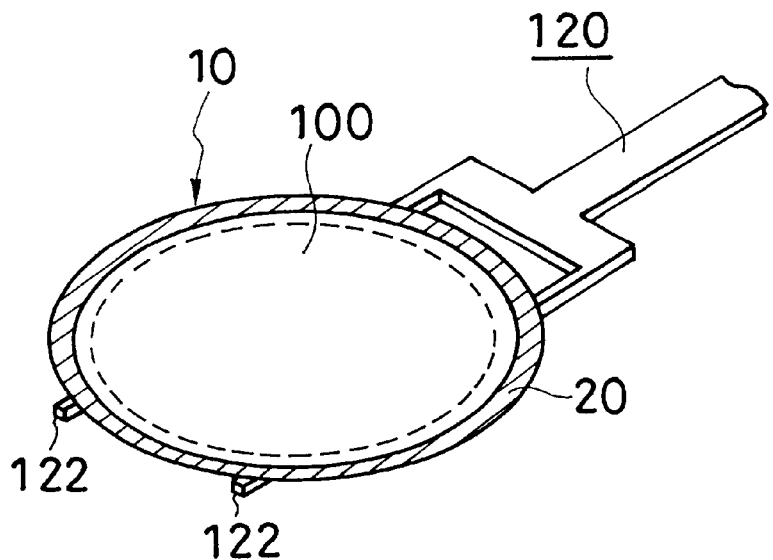
FIGS. 2 and 3 are perspective views for explaining the semiconductor wafer processing apparatus according to the first embodiment.

According to a first embodiments a wafer holding member 10 as shown in FIGS. 1A to 1C is used. The wafer holding member 10 comprises a ring-like member 20 which includes an outer ring-like member 22 and an inner ring-like member 24. An upper surface 25 of the inner ring-like member 24 is formed into a wafer supporting portion 26 for supporting an outer peripheral portion of a semiconductor wafer. An upper surface 23 of the outer ring-like member 22 is formed higher than the upper surface 25 of the inner ring-like member 24. An inner diameter of the outer ring-like member 22 is greater than an outer diameter of the semiconductor wafer. The semiconductor wafer is mounted inside of the outer ring-like member 22.

Figure 6:
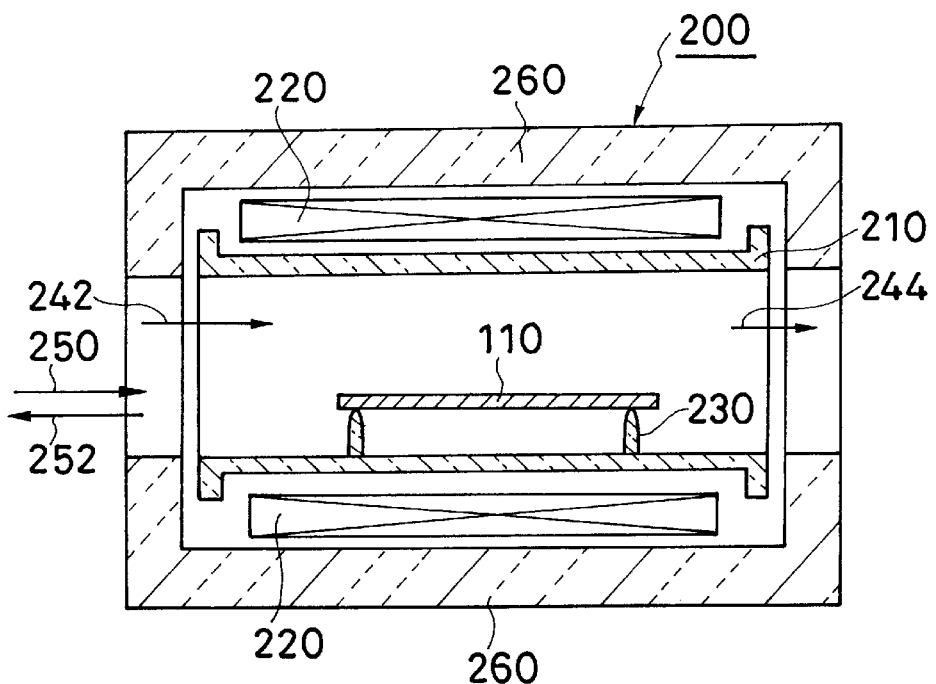
FIG. 6 is a sectional view for explaining the semiconductor wafer processing apparatus according to the first embodiment.

Referring to FIG. 6, a semiconductor wafer processing chamber 200 used in the semiconductor wafer processing apparatus of the first embodiment comprises a reaction tube 210, heaters 220 (resistance heaters in the first embodiment) respectively disposed above and below the reaction tube 210, a plate 110 disposed in the reaction tube 210 and a supporting portion 230 for supporting the plate 110. The semiconductor wafer processing chamber 200 also includes a thermal insulator 260 provided to cover upper, lower, left and right portions of the reaction tube 210 and the heaters 220, and is formed into a so-called hot wall type. In the semiconductor wafer processing chamber 200, a gas is introduced into the reaction tube 210 from the left side (see the arrow 242), and is discharged to the right side of the reaction tube 210 (see the arrow 244). Further, the semiconductor wafer is introduced into the reaction tube 210 from the left side (see the arrow 250), and is carried out to the left side (see the arrow 252). During the processing of at least a predetermined number of semiconductor wafers 100, an interior of the reaction tube 210 is kept at a constant high temperature by the heaters 220.

Referring to FIGS. 2 to 6, the semiconductor wafer 100 is carried into and out of the reaction tube 210 in a manner that the semiconductor wafer 100 is mounted on the wafer supporting portion 26 of the wafer holding member 10, and the wafer holding member 10 is mounted on the wafer holding member supporting portion 121 of a mounting arm 122 of a tweezer 120.

When the semiconductor wafer 100 is transferred into the reaction tube 210, the tweezer 120 on which the wafer holding member 10 is mounted is inserted into a space 112 in the plate. 110 disposed in the reaction tube 210 from the side of a space 114 in the plate 110, and the wafer holding member 10 is mounted on supporting claws 116 provided in the space 112 in the plate 110. Thereafter, the tweezer 120 is pulled out of the reaction tube 210. When the tweezer 120 is inserted, a tip end of the tweezer 120 is inserted into a notch 118 of the plate 110.

Thereafter, in a state where the semiconductor wafer 100 is mounted on the wafer holding member 10, the processing of the semiconductor wafer 100 is conducted. This process is conducted while flowing a gas at a constant flow rate into the reaction tube 210 which is kept at a predetermined high temperature.

In the first embodiment, in order to avoid a turbulence of the gas flowing in the reaction tube 210 for forming a uniform film, an upper surface 101 of the semiconductor wafer 100, an upper surface 23 of the outer ring-like member 22 of the wafer holding member 10 and an upper surface 111 of the plate 110 are located in the same plane. The mounting arm 122 of the tweezer 120 is provided with a semiconductor wafer supporting portion 123 so that the semiconductor wafer 100 can also be mounted directly on the mounting arm 122.

Figure 7:
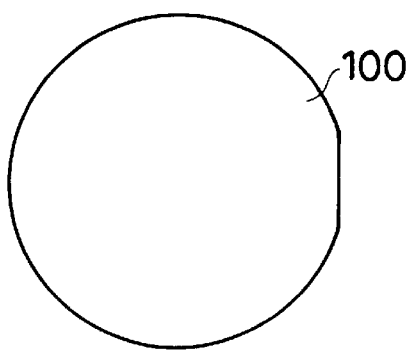
FIG. 7 is a plan view for explaining a state of the semiconductor wafer which is processed by the semiconductor wafer processing apparatus according to the first embodiment of the present invention.
Figure 9:
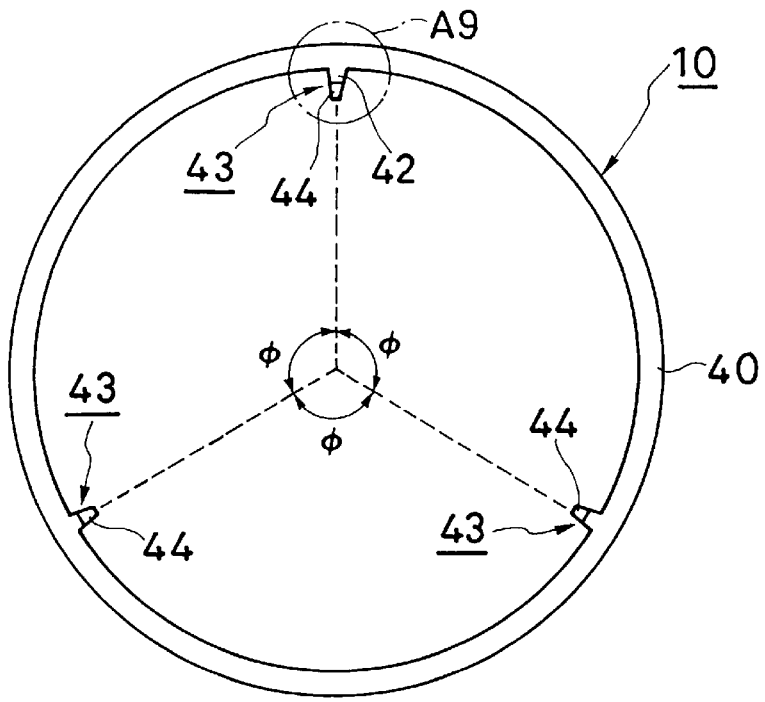
FIG. 9A is a plan view for explaining a wafer holding member used in a semiconductor wafer processing apparatus according to a third embodiment of the present invention.
FIG. 9B is a partially enlarged plan view of the portion A9 in FIG. 9A.
FIG. 9C is a sectional view taken along the line Y3—Y3 in FIG. 9B.
FIG. 9D is a sectional view taken along the line Y4—Y4 in FIG. 9B.
Figure 9:
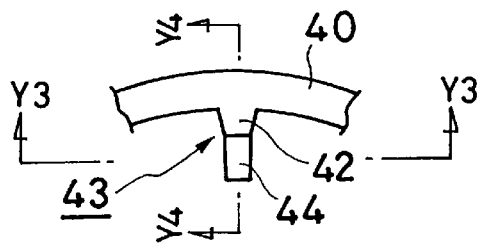
Figure 9:
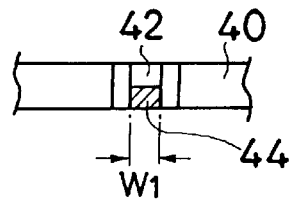
Figure 9:
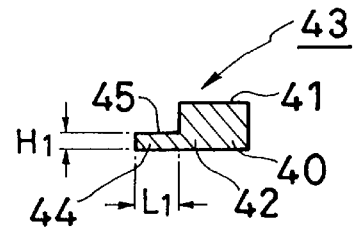

After the processing is completed, the tweezer 120 is again inserted into the space 112 in the plate 110 disposed in the reaction tube 210 from the side of the space 114 in the plate 110, and the wafer holding member 10 is again mounted on the wafer holding member supporting portion 121 of the mounting arm 122 of the tweezer 120. Then, the semiconductor wafer 100 is carried out from the reaction tube 210 by pulling the tweezer 120 on which the wafer holding member 10 is mounted out from the reaction tube 210. Thereafter, the semiconductor wafer 100 is cooled. As is shown in FIG. 7, no slip is observed in the semiconductor wafer 100 which was carried out and cooled. That is, a slip is restrained from being generated.

In the first embodiment, the wafer holding member 10 is used. When the semiconductor wafer 100 is carried out from the reaction tube 210, because the high-temperature semiconductor wafer 100 is not mounted directly on the mounting arm 122 of the tweezer 120, the semiconductor wafer 100 is prevented from being locally cooled and as a result, a slip is restrained from being generated. Further, because the processing of the semiconductor wafer 100 is conducted in a state where the semiconductor wafer 100 is mounted on the wafer holding member 10, at the time of processing, the wafer holding member 10 heated to the same high temperature as the semiconductor wafer 100. The semiconductor wafer 100 is then carried out from the reaction tube 210 in a state where the semiconductor wafer 100 is mounted on the wafer holding member 10 and thus, a slip is restrained from being generated.

Further, the wafer holding member 10 comprises a ring-like member 20, and the ring-like member 20 supports the entire outer peripheral portion of the semiconductor wafer 100. Because the ring-like member 20 surrounding the outer peripheral portion of the semiconductor wafer 100 is used in this manner, a thermal buffering effect by the ring-like member 20 can be obtained uniformly over the outer peripheral portion of the semiconductor wafer 100. As a result, in a heating up process of the semiconductor wafer 100, a rise in temperature of the outer peripheral portion of the wafer is restrained to moderate a difference in temperature of the outer peripheral portion and the central portion of the semiconductor wafer 100. Therefore, the thermal stress is reduced and the slip is restrained from being generated. In the first embodiment, because the thermal buffering effect by the ring-like member 20 can be obtained uniformly over the outer peripheral portion of the semiconductor wafer 100, a rise in temperature is restrained uniformly, which further restrains the slip from being generated. Even when the semiconductor wafer 100 is lowered in temperature also, the temperature of the outer peripheral portion of the semiconductor wafer 100 is restrained from being lowered, and the slip is restrained from being generated. The restraint of the temperature drop is also uniform, which further restrain the slip from being generated.

Also, because the ring-like member 20 supports the entire outer peripheral portion of the semiconductor wafer 100, the self-weight stress is reduced to restrain the slip from being generated.

Further, when the semiconductor wafer 100 is mounted on the wafer holding member 10 a bottom surface of the wafer holding member 10 is located lower than a bottom surface of the semiconductor wafer 100 and therefore, when the tweezer 120 which directly transfers the semiconductor wafer 100 is used as it is, the mounting arm 122 of the tweezer 120 is not directly contacted with the semiconductor wafer 100.

In the first embodiment, the wafer holding member 10 is made of quartz.

Second Embodiment

The second embodiment differs from the first embodiment in that a wafer holding member 10 as shown in FIGS. 8A to 8E is used, and other structures are the same as those in the first embodiment. Referring to FIGS. 8A to 8E, the wafer holding member 10 comprises a ring-like member 30. The ring-like member 30 is composed of an outer ring-like member 32, an inner ring-like member 34, and three wafer supporting portions 36 provided on the inner ring-like member 34. The three wafer supporting portions 36 are disposed on the same circle at equal intervals from one another, and any adjacent two of the three wafer supporting portions 36 form the angle of 120° with respect to the center of the circle. The semiconductor wafer (not shown) is supported at its outer peripheral portion by the three wafer supporting portions 36. The upper surface 33 of the outer ring-like member 32 is formed higher than the upper surface 35 of the outer ring-like member 34 and the upper surface 37 of the wafer supporting portions 36. An inner diameter of the inner ring-like member 32 is greater than an outer diameter of the semiconductor wafer. The semiconductor wafer is mounted inside of the outer ring-like member 32.

In the second embodiment also, because the wafer holding member 10 is used, the semiconductor wafer is prevented from being locally cooled by the tweezer and as a result, the slip is restrained from being generated.

Further, the wafer holding member 10 comprises the ring-like member 30, and the ring-like member 30 is composed of the outer ring-like member 32 which is larger than the semiconductor wafer, the inner ring-like member 34 which is superposed on the outer peripheral portion of the semiconductor wafer, and the wafer supporting portion 36 provided on the inner ring-like member 34 and therefore, the thermal buffering effect by the ring-like member 30 is obtained uniformly over the outer peripheral portion of the semiconductor wafer. As a result, a temperature rise of the outer peripheral portion of the semiconductor wafer is uniformly restrained and a temperature drop of the outer peripheral portion is also restrained uniformly and thus, the slip is restrained from being generated.

The outer peripheral portion of the semiconductor wafer is supported at equal intervals by the wafer supporting portions 36 and therefore, the self-weight stress is also reduced to restrain the slip from being generated.

Third Embodiment

The third embodiment differs from the first embodiment in that a wafer holding member 10 as shown in FIGS. 9A to 9D is used, and other structures are the same as those in the first embodiment. Referring to FIGS. 9A to 9D, the wafer holding member 10 is composed of a ring-like member 40 and three projections 43 which project into a space inside the ring-like member 40. Each of the projections 43 includes a base portion 42 and a wafer supporting portion 44. The three wafer supporting portions 44 are disposed on the same circle at equal intervals from one another, and any adjacent two of the three wafer supporting portions 44 form the angle of 120° 0 with respect to the center of the circle. The semiconductor wafer is supported at its outer peripheral portion by the three wafer supporting portions 44. The upper surface 41 of the ring-like member 40, which is at the same height as the upper surface 43 of the base portion 42, is formed higher than the upper surface 45 of the wafer supporting portions 44. An inner diameter of the ring-like member 40 is greater than an outer diameter of the semiconductor wafer. The semiconductor wafer is mounted inside of the ring-like member 40 and the base portions 42.

In the third embodiment also, because the wafer holding member 10 is used, the semiconductor wafer is prevented from being locally cooled by the tweezer and as a result, the slip is restrained from being generated.

Further, the wafer holding member 10 comprises the ring-like member 40, and the inner diameter of the ring-like member 40 is greater than the outer diameter of the semiconductor wafer and therefore, the thermal buffering effect by the ring-like member 40 is obtained uniformly over the outer peripheral portion of the semiconductor wafer. As a result, a temperature rise of the outer peripheral portion of the semiconductor wafer is uniformly restrained and a temperature drop of the outer peripheral portion is also restrained uniformly and thus, the slip is restrained from being generated.

The outer peripheral portion of the semiconductor wafer is supported at equal intervals by the wafer supporting portions 44 and therefore, the self-weight stress is also reduced to restrain the slip from being generated.

In the third embodiment, each of the wafer supporting portions 44 has a width W1 of 3 mm, a thickness H1 of 2 mm, and a length L1 of 8 mm. Such a size of the wafer supporting portion 44 makes it possible, at the time of temperature rise and temperature drop of the semiconductor wafer, to restrain a difference in temperature between the wafer supporting portion 44 and a portion of the semiconductor wafer which is supported, and the slip is restrained from being generated accordingly.

Fourth to Sixth Embodiments

Figure 10:
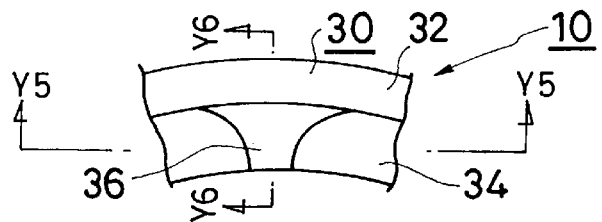
FIG. 10A is a partially enlarged plan view for explaining a wafer holding member used in a semiconductor wafer processing apparatus according to a fourth embodiment of the present invention.
FIG. 10B is a sectional view taken along the line Y5—Y5 in FIG. 10A.
FIG. 10C is a sectional view taken along the line Y6—Y6 in FIG. 10A.
Figure 10:
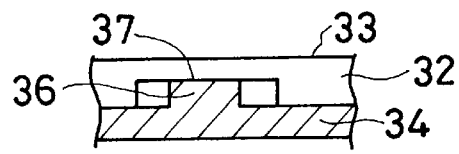
Figure 10:
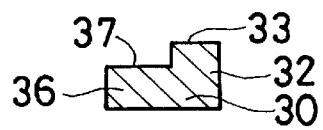
Figure 11:
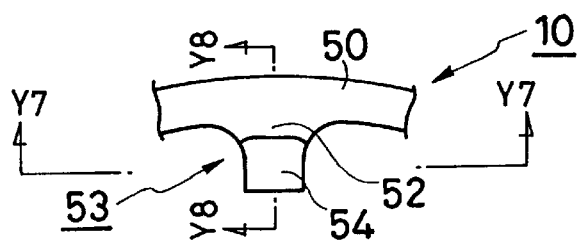
FIG. 11A is a partially enlarged plan view for explaining a wafer holding member used in a semiconductor wafer processing apparatus according to a fifth embodiment of the present invention.
FIG. 11B is a sectional view taken along the line Y7—Y7 in FIG. 11A.
FIG. 11C is a sectional view taken along the line Y8—Y8 in FIG. 11A.
Figure 11:
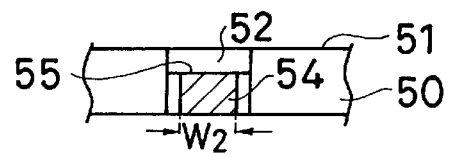
Figure 11:
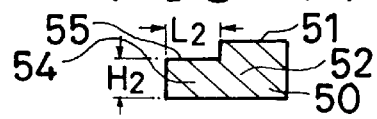
Figure 12:
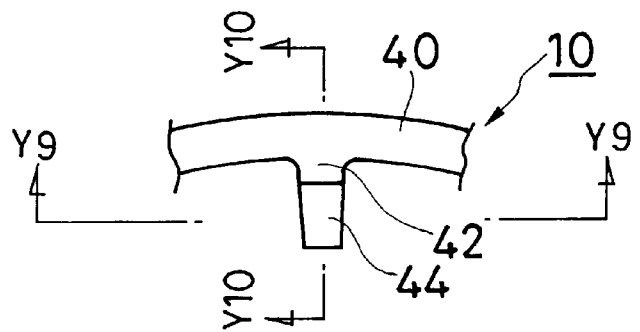
FIG. 12A is a partially enlarged plan view for explaining a wafer holding member used in a semiconductor wafer processing apparatus according to a sixth embodiment of the present invention.
FIG. 12B is a sectional view taken along the line Y9—Y9 in FIG. 12A.
FIG. 12C is a sectional view taken along the line Y10—Y10 in FIG. 12A.
Figure 12:
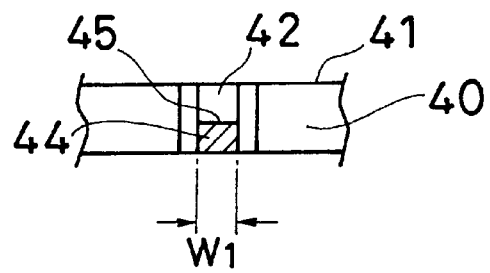
Figure 12:
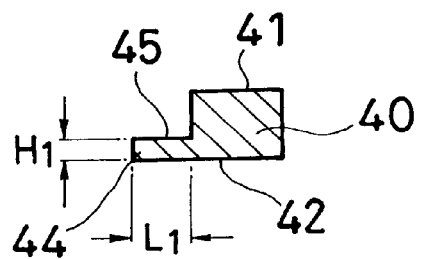

The fourth to sixth embodiments differ from the first embodiment in that wafer holding members 10 respectively shown in FIGS. 10 to 12 are used, and other structures are the same as those in the first embodiment. Each of the wafer holding members 10 is made of SiC.

The wafer holding member 10 shown in FIGS. 10A to 10C has the same structure as that of the wafer holding member 10 shown in FIGS. 8A to 8E.

The wafer holding member 10 shown in FIGS. 11A to 11C is composed of a ring-like member 50, and three projections 53 projecting into a space inside the ring-like member 50. Each of the projections 53 includes a base portion 52 and a wafer supporting portion 54. The three wafer supporting portions 54 are disposed on the same circle at equal intervals from one another, and any adjacent two of the three wafer supporting portions 54 form the angle of 120° with respect to the center of the circle. The semiconductor wafer is supported at its outer peripheral portion by the three wafer supporting portions 54. The upper surface 51 of the ring-like member 50, which is at the same height as an upper surface of the base portion 52, is formed higher than the upper surface 55 of the wafer supporting portions 54. An inner diameter of the ring-like member 50 is greater than an outer diameter of the semiconductor wafer. The semiconductor wafer is mounted inside of the ring-like member 50 and the base portions 52. Each of the wafer supporting portions 54 has a width W2 of 7 mm, a thickness H2 of 2 mm, and a length L2 of 8 mm.

The wafer holding member 10 shown in FIGS. 12A to 12C has the same structure as that of the wafer holding member 10 shown in FIGS. 9A to 9D. Each of the wafer supporting portions 44 has a width W1 of 3 mm, a thickness H1 of 2 mm; and a length L1 of 8 mm.

By using the wafer holding member 10 shown in FIGS. 10A to 12C, the semiconductor wafer is prevented from being locally cooled by the tweezer and the slip is restrained from being generated. Further, the thermal buffering effect by the ring-like member 30, 40 and 50 uniformly restrain a temperature rise of the outer peripheral portion of the semiconductor wafer and a temperature drop of the outer peripheral portion is also restrained uniformly and thus, the slip is restrained from being generated. Further, the outer peripheral portion of the semiconductor wafer is supported at equal intervals by the wafer supporting portions 36, 44 and 54 and therefore, the self-weight stress is also reduced to restrain the slip from being generated. Therefore, by using the above described wafer holding member 10, the slip of the semiconductor wafer is restrained from being generated. However, depending on a temperature rise condition, a rise in temperature of the wafer holding member 10 is retarded as compared with that of the semiconductor wafer. Therefore, a difference in temperature is produced among the wafer supporting portions 36, 44 and 54, and a portion of the semiconductor wafer which is supported and therefore, a defect in a crystal may be produced in some cases. Further, depending on a temperature drop condition, a drop in temperature of the wafer holding member 10 is retarded as compared with that of the semiconductor wafer and therefore, a difference in temperature is produced among the wafer supporting portions 36, 44 and 54 and a portion of the semiconductor wafer which is supported, and a defect in a crystal may be produced in some cases.

According to the fourth to sixth embodiments, the wafer holding members 10 shown in FIGS. 10A to 12C are respectively used, and when the semiconductor wafer is inserted into or pulled out from the reaction chamber, the semiconductor wafer is mounted on the wafer holding member 10, and both the semiconductor wafer and the wafer holding member are transferred by the tweezer. In the reaction chamber, both the semiconductor wafer and the wafer holding member 10 are placed on the wafer mount, and the processing of the semiconductor wafer is conducted.

Figure 13:
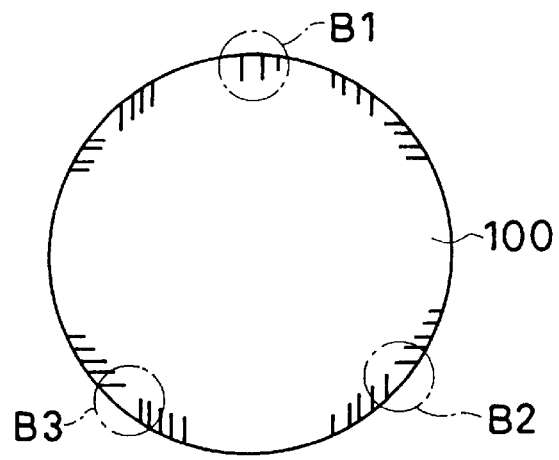
FIG. 13 is a plan view for explaining a state of the semiconductor wafer which is processed by the semiconductor wafer processing apparatus according to the fourth embodiment of the present invention.
Figure 14:
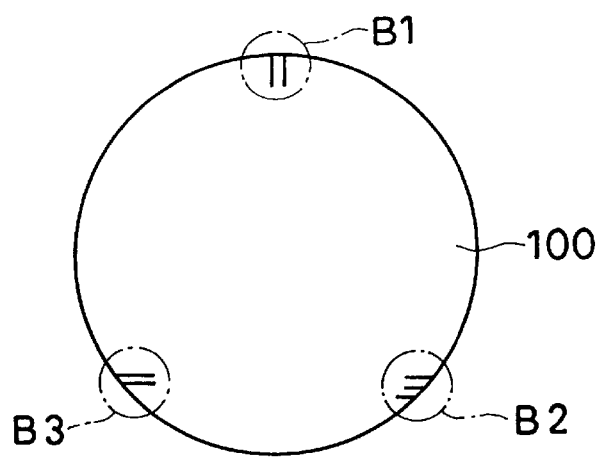
FIG. 14 is a plan view for explaining a state of the semiconductor wafer which is processed by the semiconductor wafer processing apparatus according to the fifth embodiment of the present invention.
Figure 15:
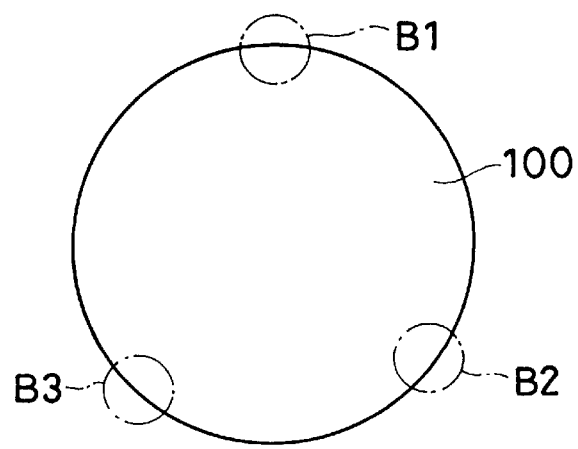
FIG. 15 is a plan view for explaining a state of the semiconductor wafer which is processed by the semiconductor wafer processing apparatus according to the sixth embodiment of the present invention.

FIGS. 13, 14 and 15 show states of the semiconductor wafer 100 after processed in the reaction chamber at 1080° C. as described above using the wafer holding members 10 shown in FIGS. 10A to 10C, 11A to 11C and 12A to 12C, respectively.

In the wafer holding member 10 shown in FIGS. 12A to 12C, when the wafer supporting portion 44 had a width W1 of 5 mm or less and a thickness H1 of 3 mm or less, no defect in crystal was observed as shown in FIG. 15. As described above, when the wafer supporting portion 44 had a width W1 of 5 mm or less and a thickness H1 of 3 mm or less, during the temperature rise process of the semiconductor wafer, a difference in temperature between the wafer supporting portion and a portion of the semiconductor wafer 100 which is supported is moderated to reduce the thermal stress, and the defect in crystal is prevented. Similarly, in the temperature drop process of the wafer, a difference in temperature between the wafer supporting portion and a portion of the semiconductor wafer 100 which is supported is moderated to prevent the defect in crystal.

Seventh Embodiment

Figure 16:
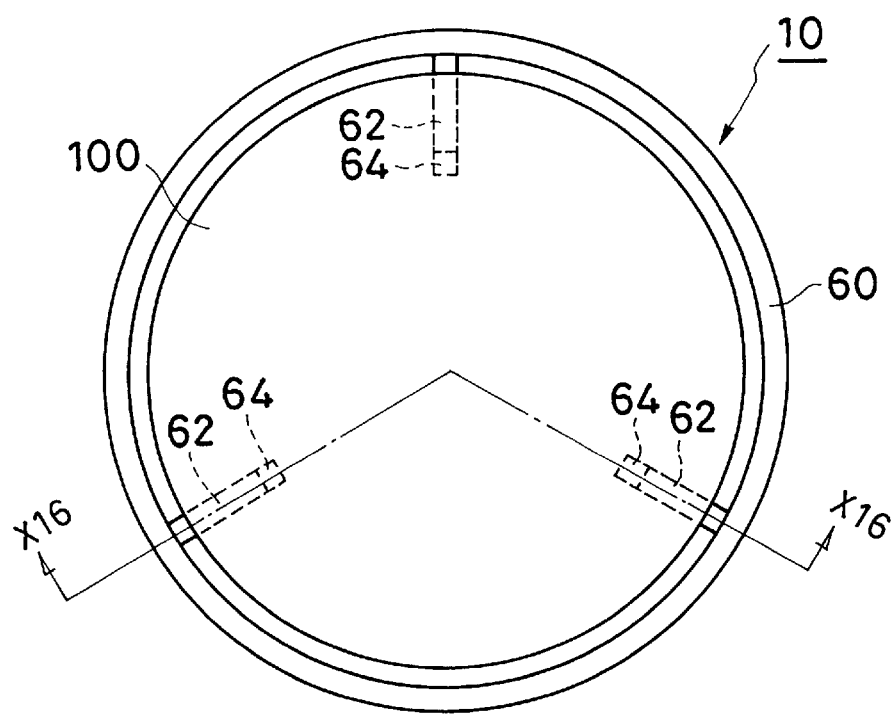
FIG. 16A is a plan view for explaining a wafer holding member used in a semiconductor wafer processing apparatus according to a seventh embodiment of the present invention.
FIG. 16B is a sectional view taken along the line X16—X16 in FIG. 16A.
Figure 16:
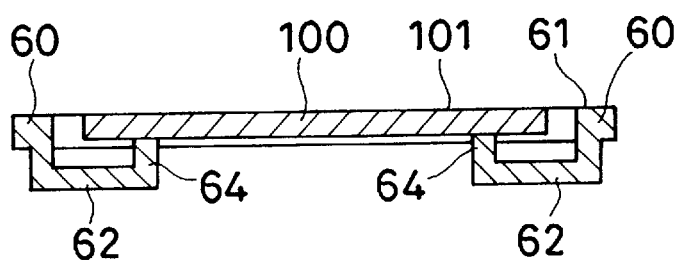
Figure 17:
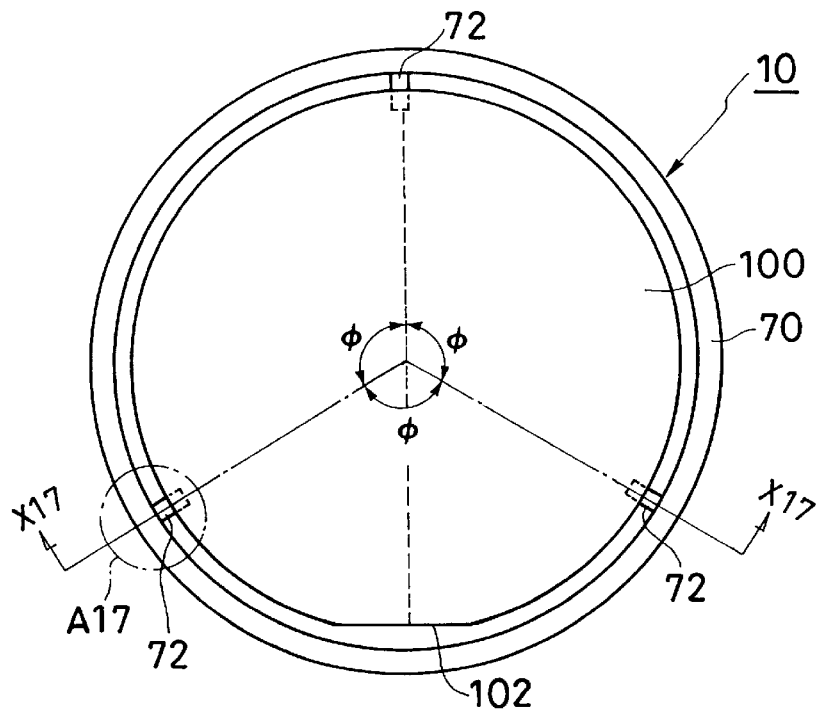
FIG. 17A is a plan view for explaining a wafer holding member used in a semiconductor wafer processing apparatus according to an eighth embodiment of the present invention.
FIG. 17B is a sectional view taken along the line X17—X17 in FIG. 17A.
FIG. 17C is a partially enlarged sectional view of the portion A17 in FIG. 17B.
FIG. 17D is a partially enlarged plan view of the portion A17 in FIG. 17A.
Figure 17:
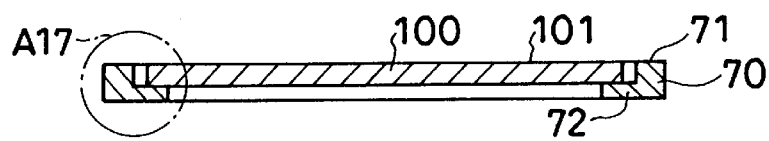
Figure 17:
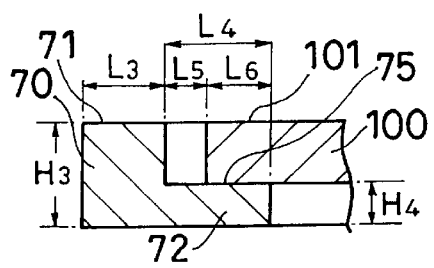
Figure 17:
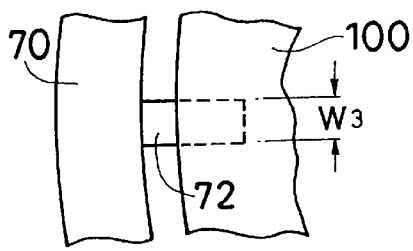
Figure 18:
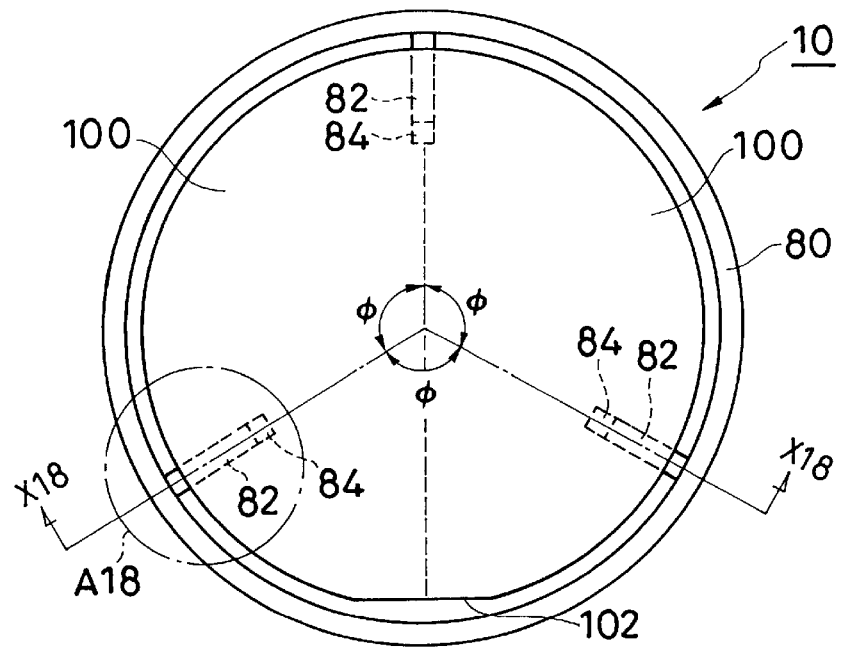
FIG. 18A is a plan view for explaining a wafer holding member used in a semiconductor wafer processing apparatus according to a ninth embodiment of the present invention.
FIG. 18B is a sectional view taken along the line X18—X18 in FIG. 18A.
FIG. 18C is a partially enlarged sectional view of the portion A18 in FIG. 18B.
FIG. 18D is a partially enlarged plan view of the portion A18 in FIG. 18A.
Figure 18:
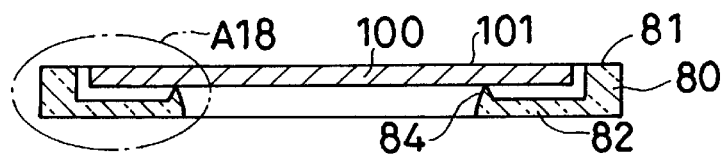
Figure 18:
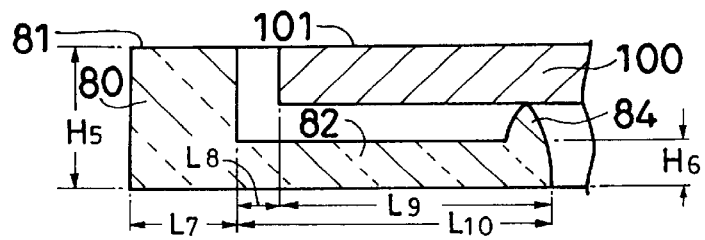
Figure 18:
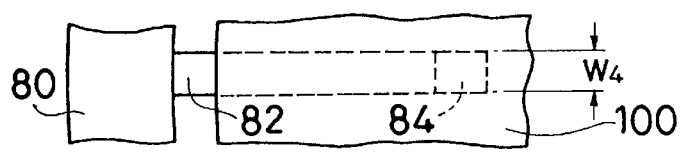

The seventh embodiment differs from the first embodiment in that a wafer holding member 10 shown in FIGS. 16A and 16B is used, and other structures are the same as those in the first embodiment. Referring to FIGS. 16A and 16B, the wafer holding member 10 is composed of a ring-like member 60 and three wafer supporting members 62 projecting into a space inside the ring-like member 60. Each of the wafer supporting members 62 is formed at its front portion with a wafer supporting portion 64, and the semiconductor wafer 100 is supported by the three wafer supporting portions 64. The three wafer supporting portions 64 are disposed on a circle having a diameter which is 70% of an outer diameter of the semiconductor wafer 100, and any adjacent two of the three wafer supporting portions 64 form the angle of 120° with respect to the center of the circle. An upper surface 61 of the ring-like member 60 is at the same height as an upper surface 101 of the semiconductor wafer 100. An inner diameter of the ring-like member 60 is greater than an outer diameter of the semiconductor wafer 100. The semiconductor wafer 100 is mounted inside the ring-like member 60.

In the seventh embodiment also, because the wafer holding member 10 is used, the semiconductor wafer is prevented from being locally cooled by the tweezer and as a result, the slip is restrained from being generated.

Further, the wafer holding member 10 comprises the ring-like member 60, and an inner diameter of the ring-like member 60 is greater than an outer diameter of the semiconductor wafer and therefore, the thermal buffering effect by the ring-like member 60 is obtained uniformly over the outer peripheral portion of the semiconductor wafer. As a result, a temperature rise of the outer peripheral portion of the semiconductor wafer is uniformly restrained and a temperature drop of the outer peripheral portion is also restrained uniformly and thus, the slip is restrained from being generated.

The inner peripheral portion of the semiconductor wafer is supported at equal intervals by the wafer-supporting portions 64 and therefore, the self-weight stress is also reduced to restrain the slip from being generated. In the seventh embodiment, because each of the three wafer supporting portions 64 has the diameter which is 70% of the outer diameter of the semiconductor wafer 100, and is disposed on the circle which is concentric to the semiconductor wafer 100, the semiconductor wafer 100 is supported at more uniform load. Therefore, a slip due to the self-weight stress of the semiconductor wafer 100 is further restrained from being generated.

Eighth Embodiment

The eighth embodiment differs from the first embodiment in that a wafer holding member 10 shown in FIGS. 17A to 17D is used, and other structures are the same as those in the first embodiment. Referring to FIGS. 17A to 17D, the wafer holding member 10 is composed of a ring-like member 70 and three wafer supporting members 72 projecting into a space inside the ring-like member 70. Three wafer supporting members 72 are disposed on the same circle at equal intervals from one another, and any adjacent two of the three wafer supporting members 72 form the angle $\phi$ of 120° with respect to the center of the circle. The semiconductor wafer 100 is supported at its outer peripheral portion by the three wafer supporting members 72. An inner diameter of the ring-like member 70 is greater than an outer diameter of the semiconductor wafer 100. The semiconductor wafer 100 is mounted inside the ring-like member 70. The upper surface 71 of the ring-like member 70 is formed higher than the upper surface 101 of the semiconductor wafer 100.

In the eighth embodiment also, because the wafer holding member 10 is used, the semiconductor wafer is prevented from being locally cooled by the tweezer and as a result, the slip is restrained from being generated.

Further, the wafer holding member 10 comprises the ring-like member 70, and an inner diameter of the ring-like member 70 is greater than an outer diameter of the semiconductor wafer 100 and therefore, the thermal buffering effect by the ring-like member 70 is obtained uniformly over the outer peripheral portion of the semiconductor wafer. As a result, a temperature rise of the outer peripheral portion of the semiconductor wafer is uniformly restrained and a temperature drop of the outer peripheral portion is also restrained uniformly and thus, the slip is restrained from being generated.

The outer peripheral portion of the semiconductor wafer 100 is supported at equal intervals by the wafer supporting portions 72 and therefore, the self-weight stress is also reduced to restrain the slip from being generated.

The wafer holding member 10 of the eighth embodiment is preferably used for an 8 inch silicon wafer. In such a case, a preferable heat capacity of a ring-like member is in a range from about 18 kJ to about 48 kJ, or in a range from about 0.5 times to 1.4 times of a heat capacity of the 8 inch silicon wafer (33.9 kJ). When the ring-like member 70 having the heat capacity within the mentioned range is used, a slip due to a difference in temperature between the outer peripheral portion and the central portion of the 8 inch silicon wafer is remarkably restrained from being generated by the thermal buffering effect of the ring-like member 70. The ring-like member 70 is preferably made of SiC. This is because SiC has a specific heat relatively smaller than (opaque) quartz and having a specific heat closer to that of the silicon wafer as the semiconductor wafer 100. As the ring-like member 70 for the 8 inch silicon wafer, a member having an inner diameter of 210 mm, a width L3 of 7 mm, a thickness H3 of 3 mm, and a heat capacity of 21.7 kJ is preferably used.

As the wafer supporting member 72, a member having a length L4 of about 11 mm, a width W3 of about 2 mm and a thickness H4 of about 1 mm is preferably used. In this case, a length L6 of the wafer supporting member 72 which contacts with the 8 inch silicon wafer of the semiconductor wafer 100 is preferably about 6 mm. By setting the length L6 like this, a length L5 of a gap between the ring-like member 70 and the 8 inch silicon wafer of the semiconductor wafer 100 is about 5 mm. However, the length L5 may be shorter than 5 mm to shorten the length L4 of the wafer supporting member 72, such a case is preferable in view of a mechanical strength of the wafer supporting member 72.

When a <100> wafer is used as the semiconductor wafer 100, it is preferable to mount the semiconductor wafer 100 to the wafer holding member 10 such that an orientation flat 102 of the wafer is positioned at the opposite side through 180° with respect to any one of the three wafer supporting members 72. With this arrangement, the slip is restrained from being generated more effectively.

Ninth Embodiment

The ninth embodiment differs from the first embodiment in that a wafer holding member 10 shown in FIGS. 18A to 18D is used, and other structures are the same as those in the first embodiment. Referring to FIGS. 18A to 18D, the wafer holding member 10 is composed of a ring-like member 80 and three wafer supporting members 82 projecting into a space inside the ring-like member 80. Each of the wafer supporting members 82 is formed at its front portion with a wafer supporting portion 84, and the semiconductor wafer 100 is supported by the three wafer supporting portions 84. Any adjacent two of the three wafer supporting portions 82 form the angle of 120° with respect to the center of the circle. Three wafer supporting portions 84 are disposed on a predetermined circle inside the semiconductor wafer 100. An upper surface 81 of a ring-like member 80 is at the same height as an upper surface 101 of the semiconductor wafer 100. Each of the wafer supporting portions 84 is tapered toward its upper end so that only a point or a very small area of the wafer supporting portion 84 contacts with the semiconductor wafer 100, thereby making it difficult to cause a slip of the semiconductor wafer 100 based on a difference in temperature the wafer supporting portion 84 and the semiconductor wafer 100. An inner diameter of the ring-like member 80 is greater than an outer diameter of the semiconductor wafer 100. The semiconductor wafer 100 is mounted inside the ring-like member 80.

In the ninth embodiment also, because the wafer holding member 10 is used, the semiconductor wafer 100 is prevented from being locally cooled by the tweezer and as a result, the slip is restrained from being generated.

Further, the wafer holding member 10 comprises the ring-like member 80, and the inner diameter of the ring-like member 80 is greater than the outer diameter of the semiconductor wafer 100 and therefore, the thermal buffering effect by the ring-like member 80 is obtained uniformly over the outer peripheral portion of the semiconductor wafer 100. As a result, a temperature rise of the outer peripheral portion of the semiconductor wafer 100 is uniformly restrained and a temperature drop of the outer peripheral portion is also restrained uniformly and thus, the slip is restrained from being generated.

The inner peripheral portion of the semiconductor wafer 100 is supported at equal intervals by the wafer supporting portions 84 and therefore, the self-weight stress is also reduced to restrain the slip from being generated.

The wafer holding member 10 of the ninth embodiment is preferably used for a 12 inch silicon wafer. In this case, a heat-capacity of the ring-like member 80 is preferably in a range from about 80 kJ to about 200 kJ, or in a range from about 1 times to about 2.5 times of a heat capacity (81.6 kJ) of the 12 inch silicon wafer. If the ring-like member 80 having a heat capacity in the mentioned range, it is possible to remarkably restrain, by the thermal buffering effect of the ring-like member 80, the generation of a slip due to a thermal stress based on a difference in temperature between an outer peripheral portion and a central portion of the 12 inch silicon wafer. The ring-like member 80 is preferably made of (opaque) quartz. This is because by using a material such as (opaque) quartz having a large specific heat, it is possible to make the ring-like ember 80 smaller while keeping the same heat capacity. Also, a ring-like member whose surface of (opaque) quartz is coated with SiC can also be used preferably.

As the ring-like member 80 for the 12 inch silicon wafer, a member having an inner diameter of 306 mm, a width L7 of 10 mm, a thickness H5 of 5 mm and a heat capacity of 115 kJ is used.

As the wafer supporting member 82, a member having a length L10 of about 33 mm, a width W4 of about 2 mm and a thickness H6 of about 3 mm is preferably used. In this case, a length L9 of that portion of the wafer supporting member 82 which is superposed on the 12 inch silicon wafer 100 as viewing on a plane is preferably set at 30 mm. By setting the length L9 like this, a length L8 of a gap between the ring-like member 80 and the 12 inch silicon wafer 100 is about 3 mm. The length L8 is preferably 5 mm or less in view of a mechanical strength of the wafer supporting member 82. Further, the length L9 of that portion of the wafer supporting member 82 which is superposed on the 12 inch silicon wafer 100 as viewing on a plane is preferably about 45 mm (that is, the three wafer supporting portions 84 are disposed at equal intervals from one another on a circle which has a diameter of 70% of an outer diameter of the 12 inch silicon wafer 100 and is concentric to the latter) if attention is paid only to support the 12 inch silicon wafer 100 with uniform load to restrain the generation of a slip due to a self-weight stress of the 12 inch silicon wafer 100. However, if the attention is paid to a mechanical strength of the wafer supporting member 82 as well as the uniform load, the length L9 is preferably in a range of 22 mm to 40 mm (that is, the three wafer supporting portions 84 are disposed at equal intervals from one another on a circle which has a diameter of 73% to 85% of the outer diameter of the 12 inch silicon wafer 100 and is concentric to the latter). Even if the length L9 is set in the latter range, it is possible to support the 12 inch silicon wafer 100 with substantially uniform load to restrain the generation of the slip due to the self-weight stress of the 12 inches silicon wafer 100, and to provide the wafer supporting member 82 with a sufficient mechanical strength to support the 12 inches silicon wafer 100.

When a <100> wafer is used as the semiconductor wafer 100, it is preferable to mount the semiconductor wafer 100 to the wafer holding member such that an orientation flat 102 of the wafer is positioned at the opposite side through 180° with respect to any one of the three wafer supporting members 82. With this arrangement, the slip is restrained from being generated more effectively.

Tenth Embodiment

Any of the wafer holding members 10 used in the first to ninth embodiments can be used as a wafer holding member 10 of the tenth embodiment.

Figure 3:
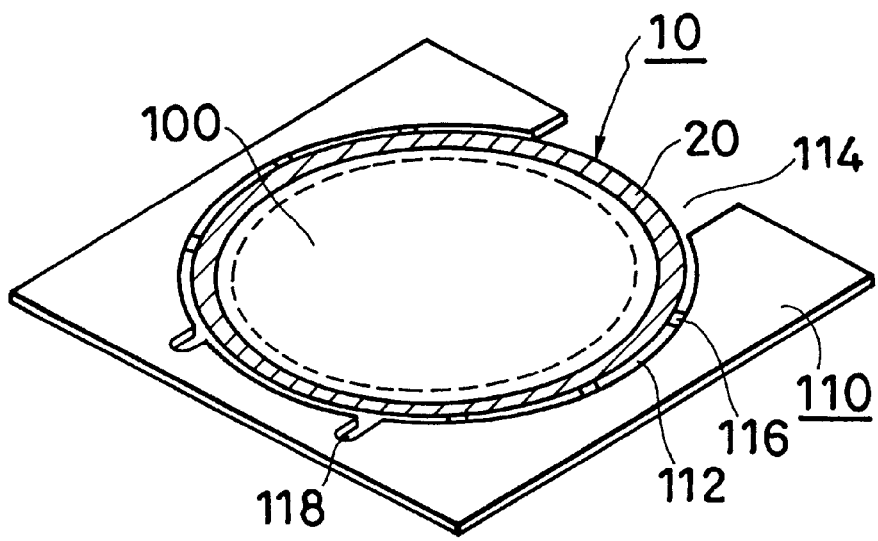
Figure 5:
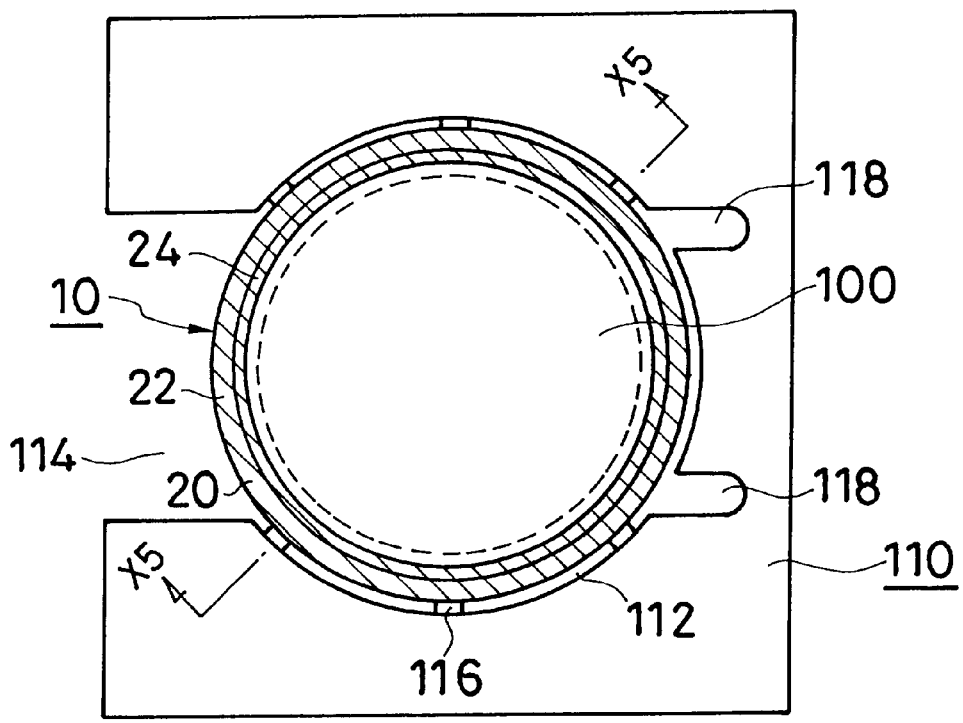
FIG. 5A is a plan view for explaining the semiconductor wafer processing apparatus according to the first embodiment.
FIG. 5B is a sectional view taken along the line X5—X5 in FIG. 5A.
Figure 5:
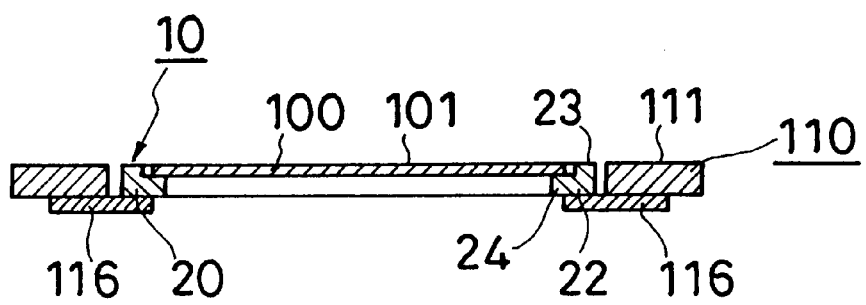
Figure 19:
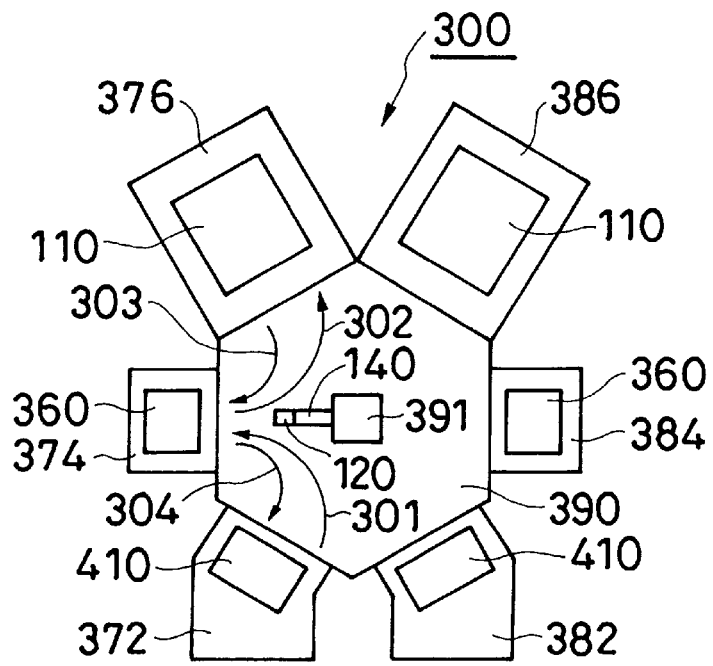
FIGS. 19 and 20 are plan views for explaining a semiconductor wafer processing apparatus according to a tenth embodiment of the present invention.
Figure 20:
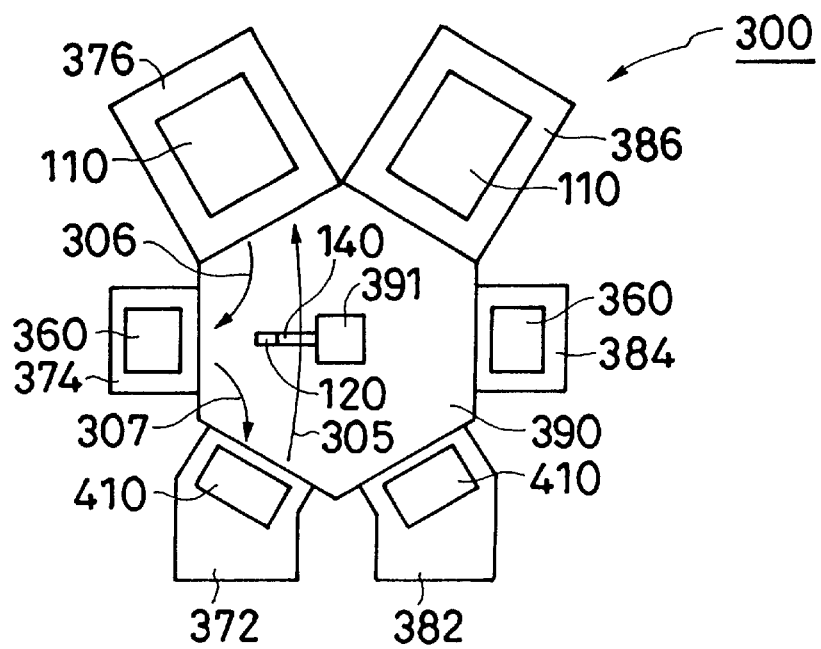
Figure 40:
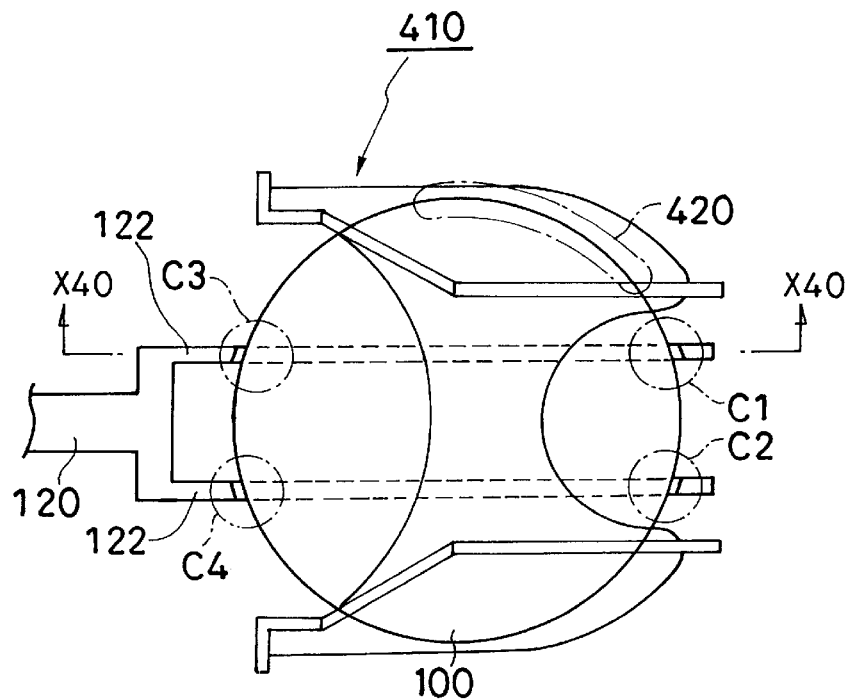
Figure 40:
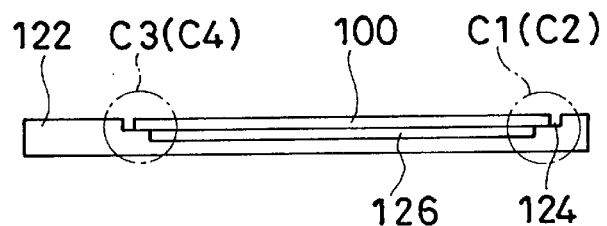

Referring to FIGS. 19 and 20, a semiconductor wafer processing apparatus 300 of the tenth embodiment is a single wafer processing type cluster semiconductor processing apparatus, and includes a hexagonal transfer chamber 390, processing chambers 376, 386 respectively provided at side walls of the transfer chamber 390, cooling chambers 374, 384 and cassette chamber 372, 382. A transfer robot 391 having a tweezer 120 is provided in the transfer chamber 390. In the processing chambers 376 and 386, various processes such as film formation on a semiconductor wafer and thermal treatment are conducted. Each of the processing chambers 376 and 386 has the same structure as that of the wafer processing chamber 200 shown in FIG. 6, and a plate having the same structure as that shown in FIGS. 3 and 5 is provided in each of the processing chambers 376 and 386. A cassette for semiconductor wafers 410 is transferred into or out from the cassette chambers 372 and 382. The cassette 410 is the same as that shown in FIGS. 40A and 405.

An exchanging member 360 shown in FIGS. 21A and 21B is provided in each of the cooling chambers 374 and 384. The exchanging member 360 includes a rod 350, a substrate 340 mounted on the rod 350, rack supporting portions 310 mounted on the substrate 340, and racks 320 respectively provided on the rack supporting portions 310. The rack 320 is provided at its tip end with a wafer supporting portion 322 so that the semiconductor wafer 100 is supported at four points. The wafer supporting portions 322 are disposed at substantially equal distances from one another on a circle which is concentric to the semiconductor wafer 100.

Figure 22:
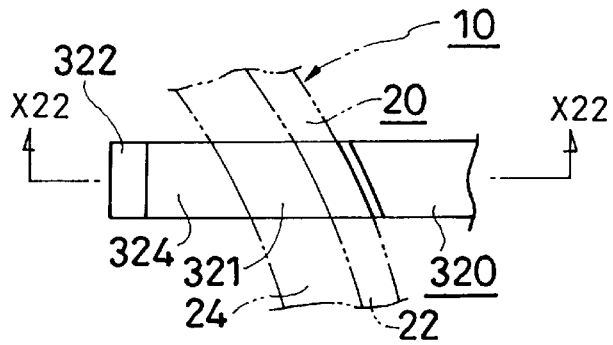
Figure 22:
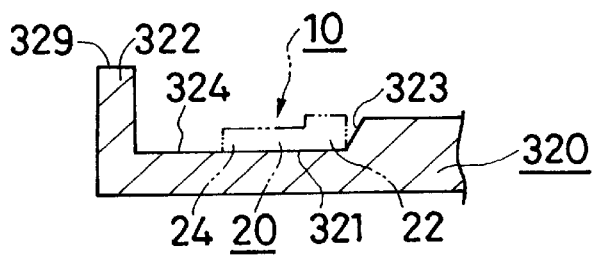

As is shown in FIGS. 22A and 22B, the rack 320 is provided with a groove 324 whose bottom surface is formed into a wafer holding member supporting portion 321. The wafer holding member 10 is mounted on the wafer holding member supporting portion 321 Although the present tenth embodiment will be described hereinafter while taking the case of the ring-like member 20 of the first embodiment shown in FIGS. 1A to 1C as an example, the wafer holding member 10 of the second to ninth embodiment can likewise be used. Because the groove 324 at the side of a side slop 323 can be used as a standard or criterion for positioning the wafer holding member 10, it is possible to minimize a deviation in relative position of the semiconductor wafer 100 and the wafer holding member 10. The groove 324 at the side of the side slop 323 has a shape substantially the same as that of a portion of the outer periphery of the ring-like member 20. An upper surface 329 of the wafer supporting portion 322 is higher than the wafer holding member supporting portion 321.

Figure 23:
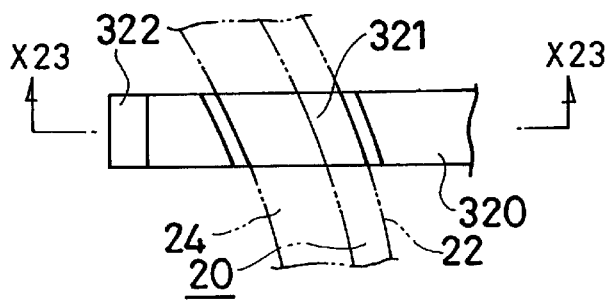
Figure 23:
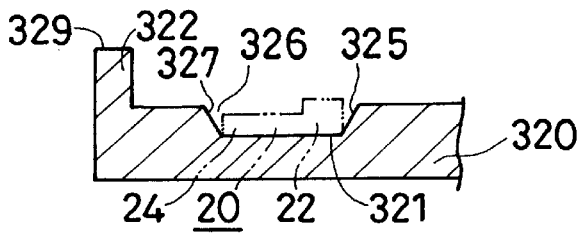

The rack 320 may have a structure as shown in FIGS. 23A ad 23B. In FIGS. 22A and 225, the groove 326 is provided up to just under the wafer supporting portion 322. Whereas, in FIGS. 23A and 23B, the groove 326 is not provided up to just under the wafer supporting portion 322, but a width of the groove 326 is substantially the same as a width of the ring-like member 20. In this case also, the bottom surface of the groove 326 functions as the wafer holding member supporting portion 321. And the ring-like member 20 which is the wafer holding member is mounted on the wafer holding member supporting portion 321. In this case, opposite sides of the groove 324 at the sides of the side slopes 325 and 327 can be used as a standard or criterion for positioning the wafer holding member 10, it is possible to minimize a deviation in relative position of the semiconductor wafer 100 and the wafer supporting member 10. The groove 324 at the side of the side slop 325 has a shape substantially the same as a portion of the outer periphery of the ring-like member 20, and the groove 324 at the side of the side slop 327 has a shape substantially the same as a portion of an inner periphery of the ring-like member 20. The upper surface 329 of the wafer supporting portion 322 is higher than the wafer holding member supporting portion 321.

A transfer method of the semiconductor wafer 100 according to the tenth embodiment will be described below.

Referring to FIGS. 19, 21A and 21B, a case in which the wafer holding member 10 is used to process the semiconductor wafer 100 will be described.

The transfer robot 391 includes a multiple joints and an arm 140. By rotating and/or extending and contracting the arm 140, the tweezer 120 provided at a top end of the arm 140 is moved in a horizontal direction. Further, by vertically moving the transfer robot 391, the tweezer 120 is moved vertically. The tweezer 120 has the same structure as the tweezer 120 shown in FIG. 4.

First, the semiconductor wafer 100 is directly mounted on the mounting arm 122 of the tweezer 120 of the transfer robot 391 from the cassette 410 in the cassette chamber 372. Then, the semiconductor wafer 100 is pulled out from the cassette chamber 372 and is transferred into the cooling chamber 374 (transfer course 301).

Thereafter, the tweezer 120 having the semiconductor wafer 100 directly thereon is inserted into a position 132 of the exchanging member 360 mounted in the cooling chamber 374.

After that, the mounting arm 122 of the tweezer 120 is lowered to a position 134, and the semiconductor wafer 100 is mounted on the four wafer supporting portions 322.

After the tweezer 120 is once returned to a home (safe) position, the tweezer 120 is inserted into a position 136 to lift the mounting arm 122 of the tweezer 120 up to the position 132, thereby mounting, on the mounting arm 122, the wafer holding member 10 to mount the semiconductor wafer 100 on the wafer holding Inter 10. The wafer holding member 10 is provided beforehand on the exchanging member 360 which is provided in the cooling chamber 374.

After that, in a state where the wafer holding member 10 having the semiconductor wafer 100 thereon is mounted on the mounting arm 122, the semiconductor wafer 100 is transferred to the processing chamber 376 (transfer course 302), and the wafer holding member 10 is mounted on the plate 110. The processing chamber 376 is kept at a predetermined high temperature at least while a predetermined number of semiconductor wafer 100 are processed.

In the processing chamber 376, the semiconductor wafer 100 is processed in a state where the semiconductor wafer 100 is mounted on the wafer holding member 10.

After the processing is completed, the wafer holding member 10 having the semiconductor wafer 100 thereon is mounted on the mounting arm 122 of the tweezer 120, and the semiconductor wafer 100 is pulled out from the processing chamber 376 as it is.

Thereafter, in a state where the wafer holding member 10 having the semiconductor wafer 100 thereon is mounted on the mounting arm, the semiconductor wafer 100 is transferred to the cooling chamber 374 (transfer course 303), and the mounting arm 122 of the tweezer 120 is inserted to a position 132 of the exchanging member 360 mounted in the cooling chamber 374.

After that, the mounting arm 122 is lowered to the position 136 to mount the semiconductor wafer 100 on the wafer supporting portion 322 of the rack 320 and to mount the wafer holding member 10 on the wafer holding member supporting portion 321 of the rack 320.

In this state, after the semiconductor wafer 100 is cooled for a given time, the mounting arm 122 of the tweezer 120 is inserted to the position 134 to lift the mounting arm 122 up to the position 132, thereby directly mounting the semiconductor wafer 100 on the mounting arm 122 of the tweezer 120, and only the semiconductor wafer 100 is unloaded into the cassette chamber 372 (transfer course 304) while leaving the wafer holding member 10 in the cooling chamber 374, and the semiconductor wafer 100 in placed in the cassette 410.

In the present embodiment, the wafer supporting portion 322 passes through a wafer supporting member 10 mounted on the wafer holding member supporting portion 321 of the rack 320, the upper surface 329 of the wafer supporting portion 322 is projected above the wafer holding member 10 mounted on the wafer holding member supporting portion 321, and a distance greater than the thickness of the mounting arm 122 of the tweezer 120 can be formed between the upper surface 329 of the wafer supporting portion 322 and the upper portion of the wafer holding member 10. Therefore, the mounting arm 122 of the tweezer 120 can be inserted between the upper surface of the wafer supporting portion 322 and the upper portion of the wafer holding member 10. Therefore, even if the wafer holding member 10 is ring-like shaped as in the present embodiment and the semiconductor wafer 100 can not be directly transferred between the wafer holding member 10 and the tweezer 120 by inserting the mounting arm 122 of the tweezer 120 into the wafer holding member 10, it is possible to mount the semiconductor wafer 100 on the upper surface 329 of the wafer supporting portion 322 by lowering downward the mounting arm 122 of the tweezer 120 having the semiconductor wafer 100 thereon from above the upper surface 329 of the wafer supporting portion 322 and then, by pulling out the mounting arm 122 of the tweezer 120 from a space between the upper surface 320 of the wafer supporting portion 322 and the upper portion of the wafer holding member 10. Further, the semiconductor wafer 100 can be mounted on the mounting arm 122 of the tweezer 120 by previously mounting the semiconductor wafer 100 on the upper surface 329 of the wafer supporting portion 322 and then, inserting the mounting arm 122 of the tweezer 120 between the upper surface 329 of the wafer supporting portion 322 and the upper portion of the wafer holding member 10 to lift the mounting arm 122 of the tweezer 120.

The wafer holding member 10 used in the tenth embodiment is the same as the wafer holding member 10 used in the first embodiment, in that: the semiconductor wafer 100 is processed in a state where the semiconductor wafer 100 is mounted on the wafer holding member 10; after the processing, the wafer holding member 10 having the semiconductor wafer 100 thereon is mounted on the mounting arm 122 to carry out the semiconductor wafer 100 without directly mounting the high-temperature wafer 100 on the mounting arm 122 of the low-temperature tweezer 120. Therefore, a slip is restrained from being generated as in the first embodiment. The same effect can be obtained in the present tenth embodiment not only if the wafer holding member 10 in the first embodiment is used, but also if the wafer holding member in the second to ninth embodiments is used.

In the semiconductor wafer processing apparatus 300 in the present tenth embodiment, it is possible not only to transfer the semiconductor wafer 100 by using the wafer holding member 10 as described above, but also to directly mount the semiconductor wafer 100 on the mounting arm 122 of the tweezer 120 for loading from and unloading to the processing chambers 376 and 386 without using the wafer holding member 10. When the semiconductor wafer 100 is processed at a low temperature, for example, several transferring methods having similar recipes are indicated on a display of the apparatus, and it is possible to select or change the transferring method depending on the content of the recipe. When the semiconductor wafer 100 is directly mounted on the mounting arm 122 of the tweezer 120 and is loaded to the processing chamber 376, 386, the semiconductor wafer 100 is transferred from the cassette chamber 372, 382 directly to the processing chamber 376, 386 without through the cooling chamber 374, 384.

Further, a graphical user interface (GUI) is used for make the operation easier. The user can easily select between a normal transfer mode in which the wafer holding member 10 is not used and an anti-slip transfer mode in which the wafer holding member 10 is used, and it is possible to monitor which mode is currently used.

Referring to FIGS. 20, 21A and 21B, a processing of the semiconductor wafer 100 without using the wafer holding member 10 will be described below.

First, the semiconductor wafer 100 is directly mounted on the mounting arm 122 of the tweezer 120 of the transfer robot 391 from the cassette 410 in the cassette chamber 372. And the semiconductor wafer 100 is pulled out from the cassette chamber 372 and is transferred into the processing chamber 376 which is maintained at a predetermined high temperature (transfer course 305) to conduct the processing of the semiconductor wafer 100.

After the processing is completed, the semiconductor wafer 100 is directly mounted on the mounting arm 122 of the tweezer 120, and the semiconductor wafer 100 is pulled out from the processing chamber 376 as it is.

Thereafter, in a state where the semiconductor wafer 100 is directly mounted on the mounting arm 122, the semiconductor wafer 100 is transferred to the cooling chamber 374 (transfer course 306), and the mounting arm 122 of the tweezer 120 is inserted to the position 132 of the exchanging member 360 mounted in the cooling chamber 374.

After that, the mounting arm 122 is lowered to the position 134, and the semiconductor wafer 100 is mounted on the wafer supporting portion 322 of the rack 320.

In this state, after the semiconductor wafer 100 is cooled for a given time, the mounting arm 122 of the tweezer 120 is inserted to the position 134 to lift the mounting arm 122 up to the position 132, thereby directly mounting the semiconductor wafer 100 on the mounting arm 122 of the tweezer 120 for unloading the semiconductor wafer 100 into the cassette chamber 372 (transfer course 307).

As described above, the mounting arm 122 of the tweezer 120 vertically moves only between the positions 132 and 134 and therefore, there is no need to take into account whether or not there exists the wafer holding member 10 on the rack 320.

A vertical movement of the mounting arm 122 of the tweezer 120 between the positions 132, 134 and 136 is conducted by a vertically moving mechanism of the transfer robot 391 and/or an elevator mechanism (a vertically moving mechanism of the exchanging member 360) of the cooling chamber 374, 384. Further, an operator can determine a height of rising and lowering the mounting arm between the positions on a set up screen.

Eleventh Embodiment

Figure 24:
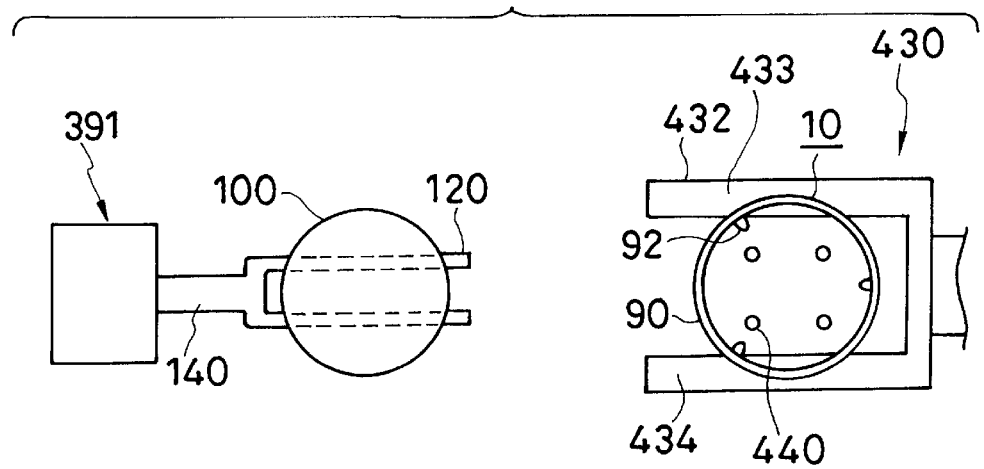
FIG. 24 is a plan view for explaining a semiconductor wafer processing apparatus according to an eleventh embodiment of the present invention.
Figure 25:
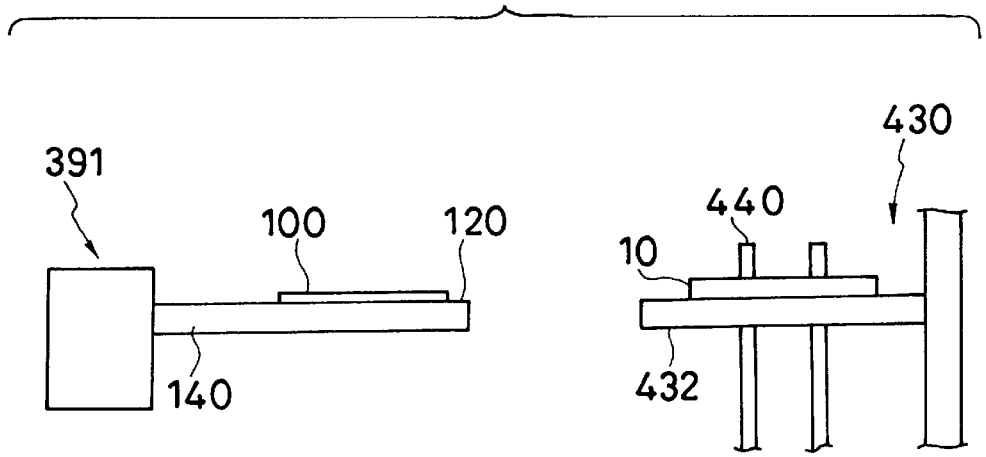
FIG. 25 is a front view for explaining the semiconductor wafer processing apparatus according to the eleventh embodiment.
Figure 26:
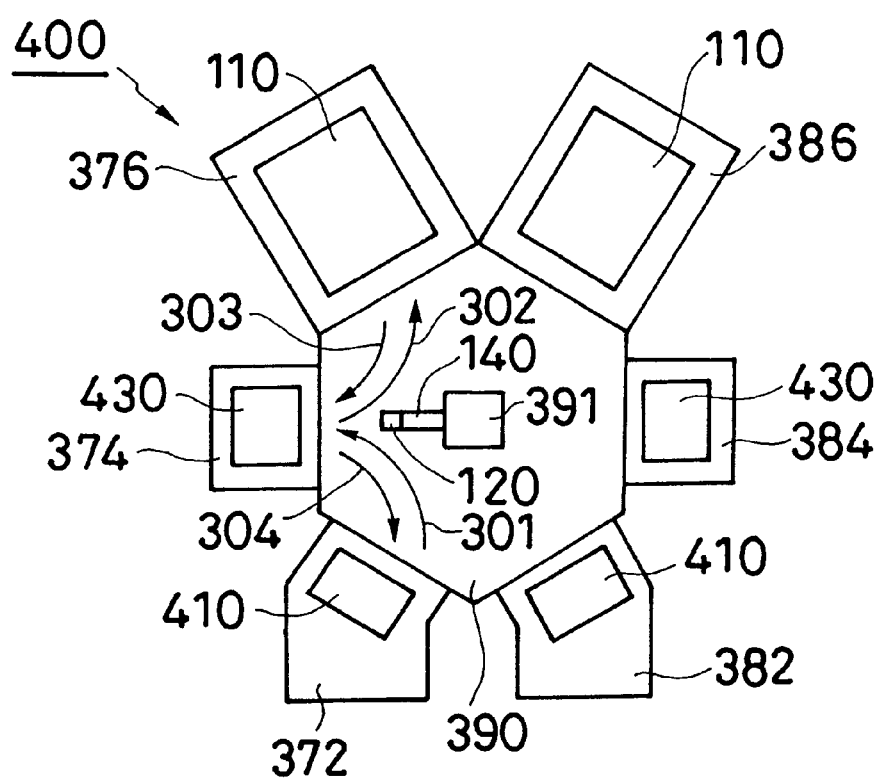
FIG. 26 is a plan view for explaining the semiconductor wafer processing apparatus according to the eleventh embodiment.

Referring to FIG. 26, the eleventh embodiment differs from the tenth embodiment in that a semiconductor wafer processing apparatus 400 of the eleventh embodiment uses an exchanging member 430 instead of the exchanging member 360 of the tenth embodiment, and other structures and the transfer robot 391 are the same as those of the tenth embodiment. Referring to FIGS. 24 and 25, the exchanging member 430 includes a mounting plate 432 and four projection pins 440. The mounting plate 432 can vertically move. Each of the four projection pins 440 is composed of a rod member, and fixed to a given substrate (not shown) and thus, is not vertically movable. The mounting plate 432 includes two supporting member 433 and 434 disposed in parallel at a predetermined intervals from each other.

Although the wafer holding member 10 used in any of the first to ninth embodiments can be used in the eleventh embodiment, the wafer holding member 10 shown in FIG. 24 includes a completely ring-like member 90 and three wafer supporting members 92 projectingly provided inside of the ring-like member 90 at equal intervals from one another.

The wafer holding member 10 is mounted on the supporting member 433 and 434 of the mounting plate 432. At that time, the four projection pins 440 are provided in a space inside the wafer holding member 10 between the supporting members 433 and 434 of the mounting plate 434, such that they do not interfere with the supporting member 433, 434, the wafer holding member 10 and the tweezer 120 of the transfer robot 391. The tweezer 120 is inserted into a space between the supporting members 433 and 434, and at that time, the tweezer 120 does not interfere with the supporting members 433 and 434.

In the eleventh embodiment, the semiconductor wafer 100 is transferred and processed in the following manner.

First, the arm 140 of the transfer robot 391 extends toward a cassette chamber 372 to take the semiconductor wafer 100 out from a cassette 410, and temporarily holds the semiconductor wafer 100 on the tweezer 120. Thereafter, the arm 140 contract and rotates toward a cooling chamber 374 as shown by a transfer course 301 in FIG. 26.

Figure 27:
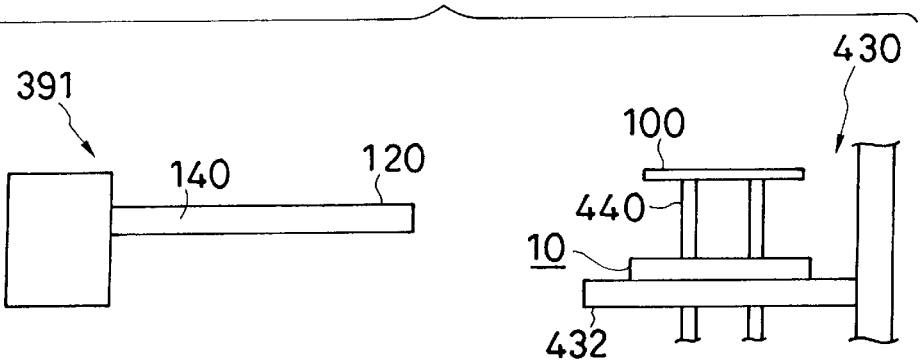
FIGS. 27A, 27B and 27C are front views for explaining the semiconductor wafer processing apparatus according to the eleventh embodiment.
Figure 27:
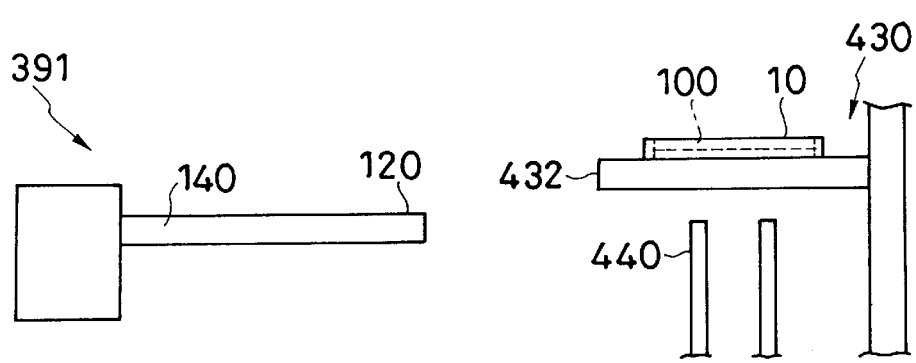
Figure 27:
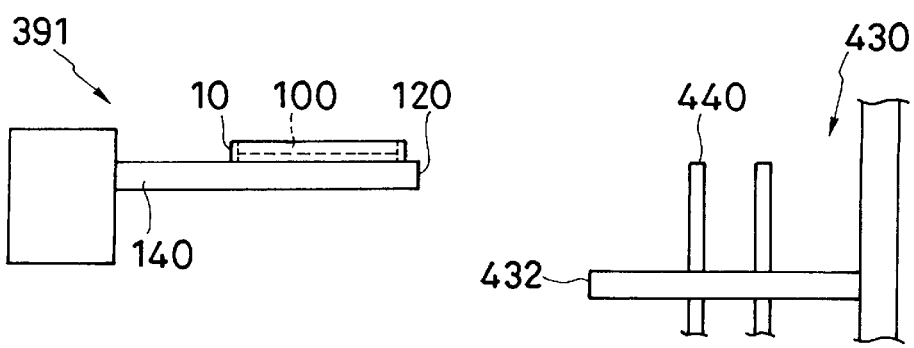

Referring to FIG. 27A, the wafer holding member 10 is mounted beforehand on the mounting plate 432 of the transfer member 430 in the cooling chamber 374, the mounting plate 432 is in its lowered state, and the projection pins 440 pass through the wafer holding member 10 and project upwardly. In this state, the tweezer 120 having the semiconductor wafer 100 thereon extends above the projection pins 440. Then, the tweezer 120 is lowered by lowering the transfer robot 391, thereby mounting the semiconductor wafer 100 on the projection pins 440.

Thereafter, as shown, in FIG. 27B, the tweezer 120 is retreated, and the mounting plate 432 is lifted to mount the semiconductor wafer 100 on the wafer holding member 10. Then, the mounting plate 432 is further lifted, and in a state where the wafer holding member 10 is held above upper ends of the projection pins 440, the tweezer 120 is extended and inserted below the wafer holding member 10. Then, as shown in FIG. 27C, the mounting plate 432 is lowered, and the wafer holding member 10 having the semiconductor wafer 100 thereon is mounted on the tweezer 120. In a state where the wafer holding member 10 is held on the tweezer 120, the arm 140 is contracted and then, the arm 140 is rotated toward the processing chamber 376 as shown by the transfer course 302 in FIG. 26. Then, the arm 140 is extended, and the wafer holding member 10 is transferred into the processing chamber 376 which is kept at a predetermined temperature. Thereafter, the tweezer 120 is lowered, and the semiconductor wafer 100 is mounted together with the wafer holding member 10 on the plate 110 of the processing chamber 376. Then, the arm 140 is contracted, and the tweezer 120 is retreated from the processing chamber 376 while leaving the wafer holding member 10 and the semiconductor wafer 100 on the plate 100.

In the processing chamber 376, after the processing is conducted for a predetermined time, the semiconductor wafer 100 is transferred to the cassette 410 by reverse procedures.

That is, the tweezer 120 is inserted below the wafer holding member 10 mounted on the plate 110 of the processing chamber 376 and then, the tweezer 120 is lifted and the wafer holding member 10 is mounted together with the semiconductor wafer 100 on the tweezer 120. Thereafter, the arm 140 is contracted to retreat the tweezer 120 and then, the arm 140 is rotated toward the cooling chamber 430 along the transfer course 303 shown in FIG. 26, and assumes a state as shown in FIG. 27C. Then, the arm 140 is extended, and in a state where the wafer holding member 10 is held above the projection pin 440, the mounting plate 432 is lifted to mount the wafer holding member 10 on the mounting plate 432 as shown in FIG. 27B and then, the arm 140 is contracted. The semiconductor wafer 100 thus pulled out together with the wafer holding member 10 from the processing chamber 376 is cooled down to a predetermined temperature together with the wafer holding member 10. Then, as shown in FIG. 27A, the mounting plate 432 and the wafer holding member 10 mounted thereon are lowered to place the semiconductor wafer 100 on the projection pins 440. Then, the arm 140 is extended to insert the tweezer 120 below the semiconductor wafer 100, and the tweezer 120 is lifted to mount only the semiconductor wafer 100 on the tweezer 120. Thereafter, the arm 140 is contracted and is rotated toward the cassette chamber 372 as shown by the transfer course 304 in FIG. 26. Then, the arm 140 is extended to mount the semiconductor wafer 100 in the cassette 410.

In the processing chamber 376, the semiconductor wafer 100 is processed in a state where it is mounted on the wafer holding member 10 having the completely ring-like member 90 and therefore, a turbulence of the reaction gas is not produced, and the reaction gas flows uniformly. Thus, the processing quality such as film formation of the semiconductor wafer 100 is stabilized. Further, because the semiconductor wafer 100 is held by the wafer supporting members 92 disposed at equal intervals from one another, it is possible to restrain the deflection due to the semiconductor wafer 100 itself and thus, to restrain a slip phenomenon due to the deflection.

As the wafer holding member 10 of the present eleventh embodiment, the wafer holding member 10 of the first to ninth embodiments can also be used. In such a case also, the semiconductor wafer 100 is processed in a state where it is mounted on the wafer holding member 10, and even after the processing is completed, the wafer holding member 10 having the semiconductor wafer thereon is mounted on the tweezer 120 to take out the semiconductor wafer 100, without mounting the high-temperature semiconductor wafer 100 directly on the low-temperature tweezer 120. Therefore, a slip is restrained from being generated.

Further, the semiconductor wafer 100 is cooled together with the wafer holding member 10 in the cooling chamber 374 in a state where the wafer holding member 10 having the semiconductor wafer 100 thereon is mounted on the mounting plate 432 and therefore, it is possible to effectively restrain the slip from being generated on the semiconductor wafer 100 at the time of cooling.

Also, by lowering the mounting plate 432, the projection pins 440 pass through the wafer holding member 10 mounted on the mounting plate 432, the tip ends of the projection pins 440 protruded above the wafer holding member 10 mounted on the mounting plate 432, and a distance greater than the thickness of the tweezer 120 can be formed between the tip ends of the projection pins 440 and the upper portion of the wafer holding member 10. Therefore, it is possible to insert the tweezer 120 between the upper portion of the wafer holding member 10 and the tip ends of the projection pins 440, i.e., the mounting portion of the semiconductor wafer 100 of the projection pins 440. Thus, even if the wafer holding member 10 is ring-like shaped as in the present embodiment and the semiconductor wafer 100 can not directly be transferred between the wafer holding member 10 and the tweezer 120 by inserting the tweezer 120 into the wafer holding member 10, the semiconductor wafer 100 can be mounted on the tip ends of the projection pins 440 by lowering downward the tweezer 120 mounting the semiconductor wafer 100 from above the tip ends of the projection pins 440 and then, by pulling out the tweezer 120 from a space between the tip ends of the projection pins 440 and the upper portion of the wafer holding member 10. Further, the semiconductor wafer 100 can be mounted on the tweezer 120 by previously mounting the semiconductor wafer 100 on the tip ends of the projection pins 440, then inserting the tweezer 120 between the tip ends of the projection pins 440 and the upper portion of the wafer holding member 10 and then, lifting the tweezer 120.

In the above description, the semiconductor wafer 100 is cooled in the cooling chamber 374 together with the wafer holding member 10 in a state where the wafer holding member 10 having the semiconductor wafer 100 thereon is mounted on the mounting plate 432. However, while the wafer holding member 10 having the semiconductor wafer 100 thereon is mounted on the mounting plate 432, the semiconductor wafer 100 is cooled down to some degree. Therefore, if a slip is not generated when the semiconductor wafer 100 is cooled in a state where it is mounted on the projection pins 440 without using the wafer holding member 10, it is possible, after the wafer holding member 10 having the semiconductor wafer 100 thereon is mounted on the mounting plate 432, to lower the mounting plate 432 and the wafer holding member 10 thereon for cooling the semiconductor wafer 100 in a state where it is mounted on the projection pins 440.

Twelfth Embodiment

Figure 21:
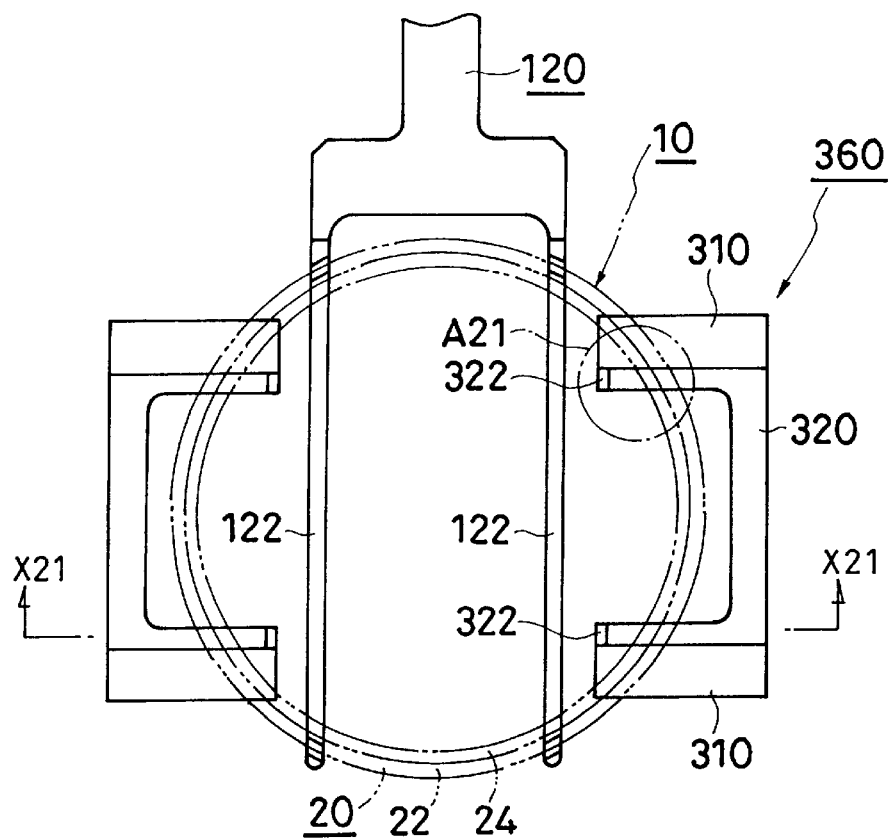
FIG. 21A is a plan view for explaining a semiconductor wafer processing apparatus according to the tenth embodiment of the present invention.
FIG. 21B is a vertical sectional view taken along the line X21—X21 in FIG. 21A.
Figure 21:
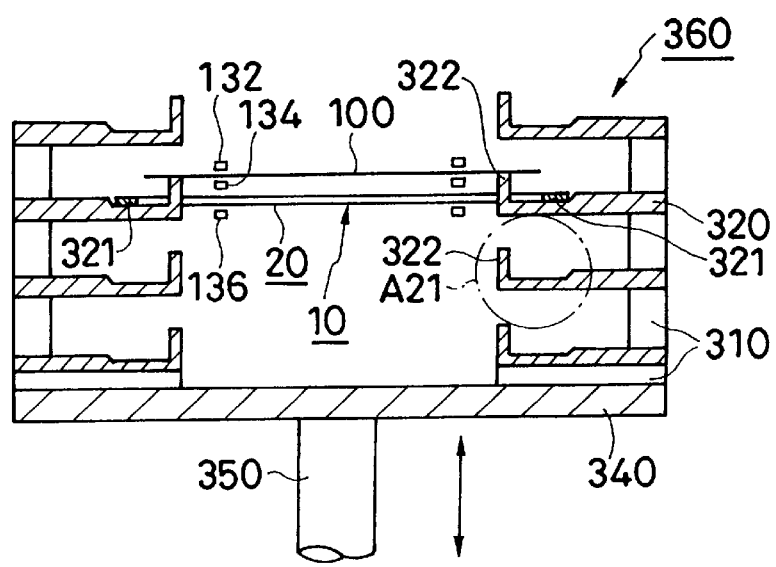
Figure 33:
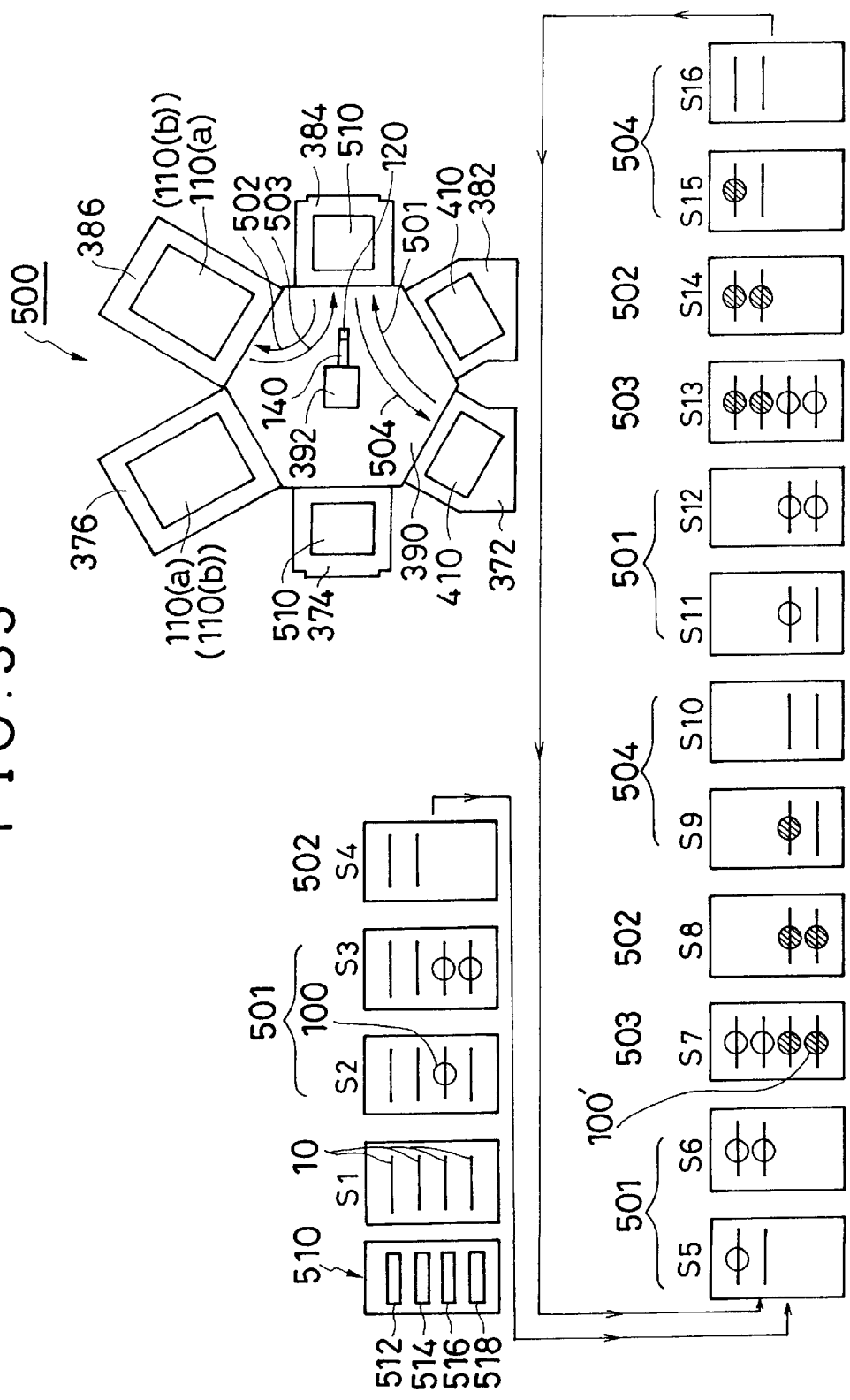
FIG. 33 is an illustration for explaining a transfer procedure in the semiconductor wafer processing apparatus according to the twelfth embodiment of the present invention.

Referring to FIG. 33, the twelfth embodiment differs from the tenth embodiment in that a semiconductor wafer processing apparatus 500 of the twelfth embodiment uses an exchanging member 510 instead of the exchanging member 391 of the tenth embodiment shown in FIGS. 19 and 21, and uses a transfer robot 392 instead of transfer robot 391, and each of the processing chambers 376 and 386 is provided with plates 110(*a*) and 110(*b*) superposed on one another. Other structures are the same as those of the tenth embodiment.

Figure 28:
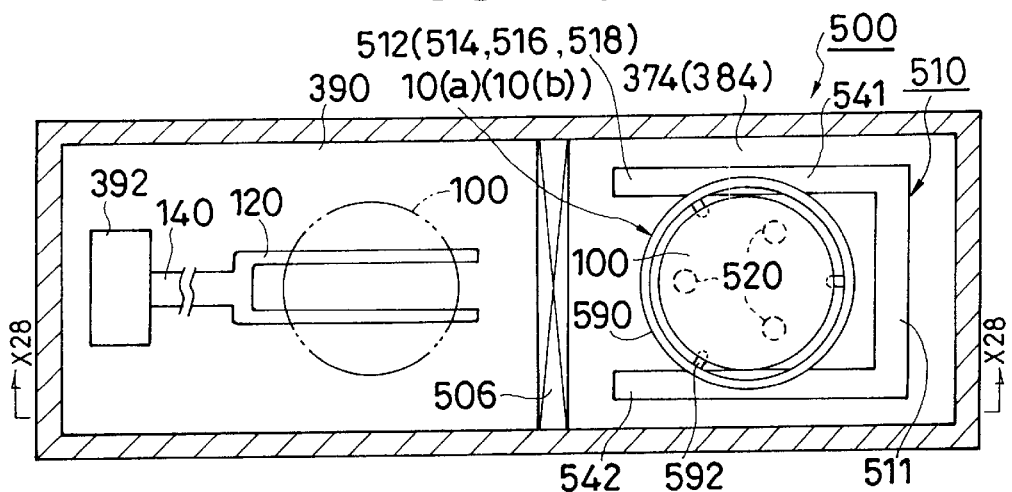
Figure 28:
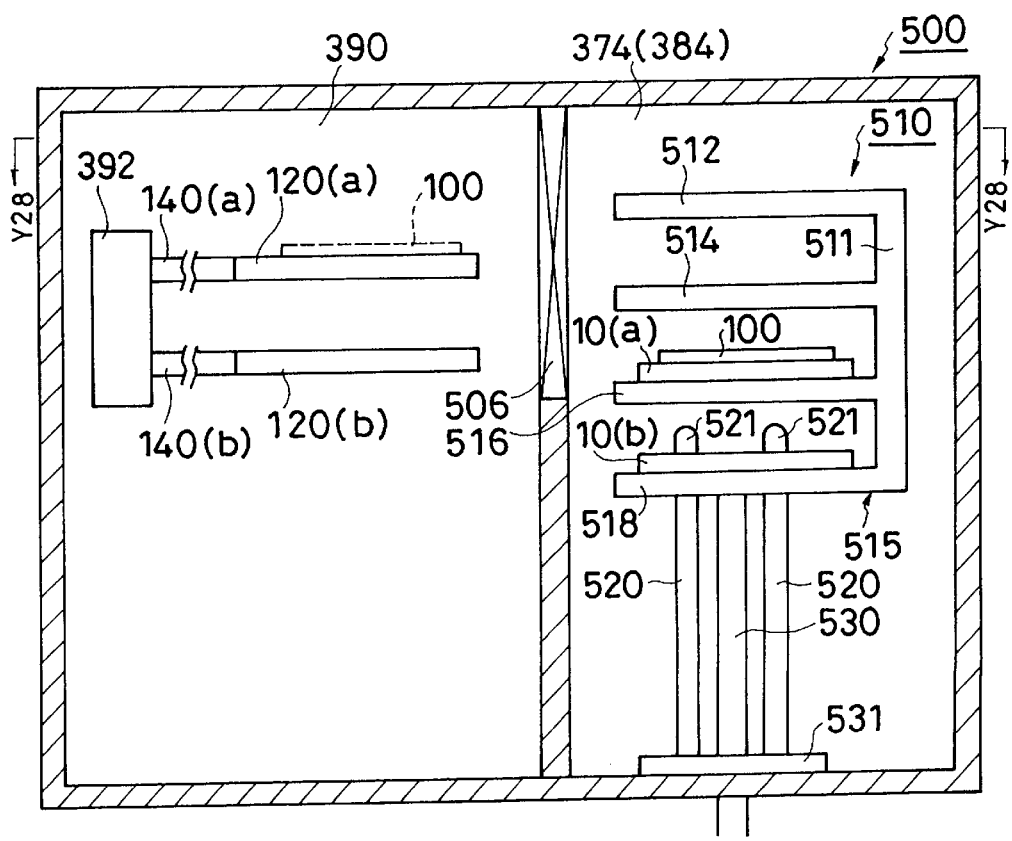

As shown in FIGS. 28A and 285, the exchanging member 510 is provided in the processing chamber 374 (384), a transfer robot 392 is provided in the transfer chamber 390, and a gate valve 506 is provided between the processing chamber 374 (384) and the transfer chamber 390.

The transfer robot 392 includes two arms 140(*a*) and 140(*b*). The robot 392 includes a multiple joints. By rotating and/or expanding and contracting each of the arms 140(*a*) and 140(*b*), tweezers 120(*a*) and 120(*b*) respectively provided at tip ends of the arms 140(*a*) and 140(*b*) are independently moved in a horizontal direction. Further, by raising and lowering the transfer robot 392, the tweezers 120(*a*) and 120(*b*) are vertically moved simultaneously. Each of the tweezer 120(*a*) and 120(*b*) has the same structure as that of the tweezer 120 shown in FIG. 4.

The exchanging member 510 includes a rod 530, a mounting member 515 provided on the rod 530, and three projection pins 520. The mounting member 515 includes four mounting plates 512, 514, 516 and 518, as well as a supporting member 511 for horizontally supporting these mounting plates. The mounting member 515 is vertically moved by moving the rod 530 vertically, thereby vertically moving the mounting plates 512, 514, 516 and 518. Each of the three projection pins 520 comprises a rod like member, and it is secured to a substrate 531 and is not vertically moved. The projection pin 520 is made of stainless steel, but its tip end is made of quartz. As viewing on a plane, the three projection pins 520 are disposed on a predetermined circle at equal intervals from one another. Each of the mounting plates 512, 514, 516 and 518 includes two supporting members 541 and 542 disposed in parallel to each other at a predetermined distance.

Although the wafer holding member 10 used in any of the first to ninth embodiments can be used as the wafer holding members 10(*a*) and 10(*b*) in the twelfth embodiment, the wafer holding members 10(*a*) and 10(*b*) shown in FIG. 28A and 28B include a completely ring-like member 590 and three wafer supporting members 592 projectingly provided inside of the ring-like member 590 at equal intervals from one another, respectively.

The wafer holding members 10(*a*) and 10(*b*) are mounted on the supporting members 541 and 542 of the mounting plates 512, 514, 516 and 518, respectively. At that time, the three projection pins 520 are provided in a space inside the wafer holding members 10(*a*) and 10(*b*) between the supporting members 541 and 542 of the mounting plates 512, 514, 516 and 518, such that they do not interfere with either the supporting member 541 and 542 or the wafer holding member 10(*a*) and 19(*b*), and also do not interfere with the tweezers 120(*a*) and 120(*b*) of the transfer robot 392. The tweezer 120(*a*) and 120(*b*) are inserted into a space between the supporting members 541 and 542, and at that time, the tweezers 120(*a*) and 120(*b*) do not interfere with the supporting members 541 and 542.

Next, referring to FIGS. 29A to 29C, 30A to 30C, 31A, 31B, 32A to 32C and 33, a basic transfer operation and process of the semiconductor wafer in the semiconductor wafer processing apparatus according to the twelfth embodiment.

Figure 29:
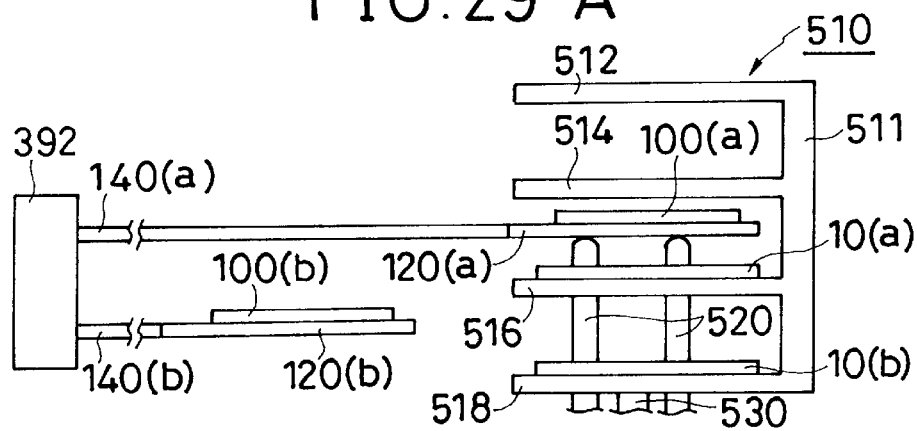
FIGS. 29A, 29B, 29C, 30A, 30B, 30C, 31A, 31B, 32A, 32B and 32C are front views for explaining the semiconductor wafer processing apparatus according to the twelfth embodiment of the present invention.
Figure 29:
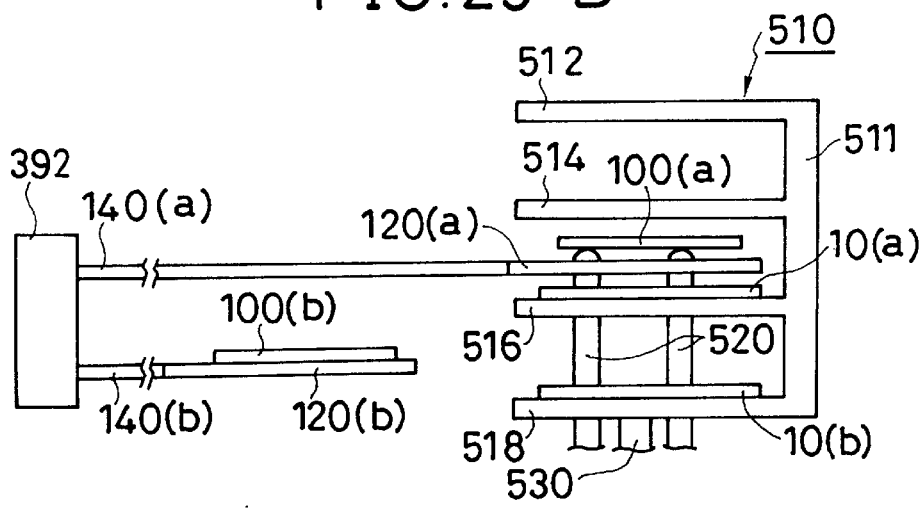
Figure 29:
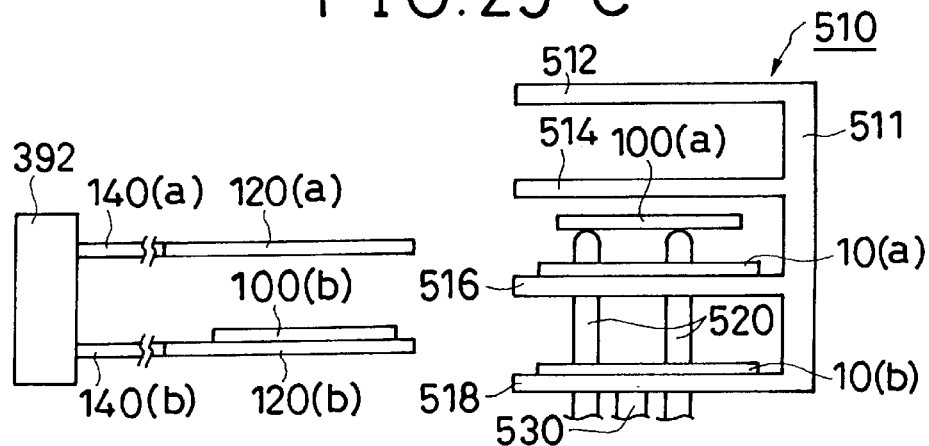

Referring to FIG. 29A, the wafer holding members 10(*a*) and 10(*b*) are first mounted on the mounting plates 516 and 518, respectively. The projection pins 520 are kept parsing through the wafer holding member 10(*a*) to project upward.

Thereafter, the arms 140(*a*) and 140(*b*) of the transfer robot 392 extend toward a cassette chamber 372 together to take out two semiconductor wafers 100(*a*) and 100(*b*) from a cassette 410, and temporarily hold the semiconductor wafers 100(*a*) and 100(*b*) on the tweezers 120(*a*) and 120(*b*). Thereafter, the arms 140(*a*) and 140(*b*) contract and rotate toward a cooling chamber 384 as shown by a transfer course 501 in FIG. 33.

Thereafter, the tweezer 120(*a*) having the semiconductor wafer 100(*a*) thereon extends above the projection pins 520.

Figure 30:
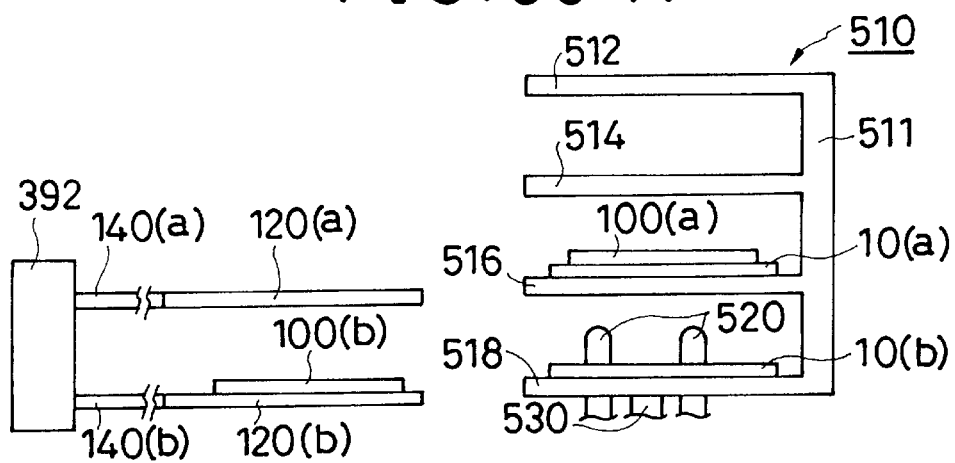
Figure 30:
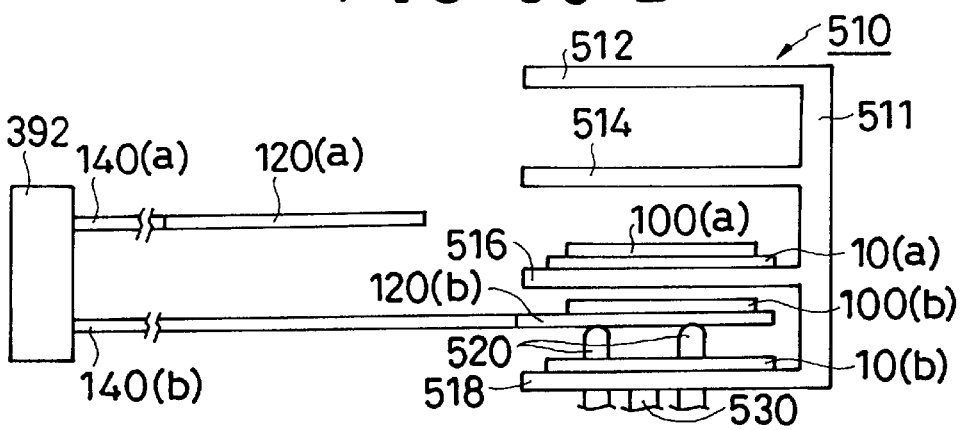
Figure 30:
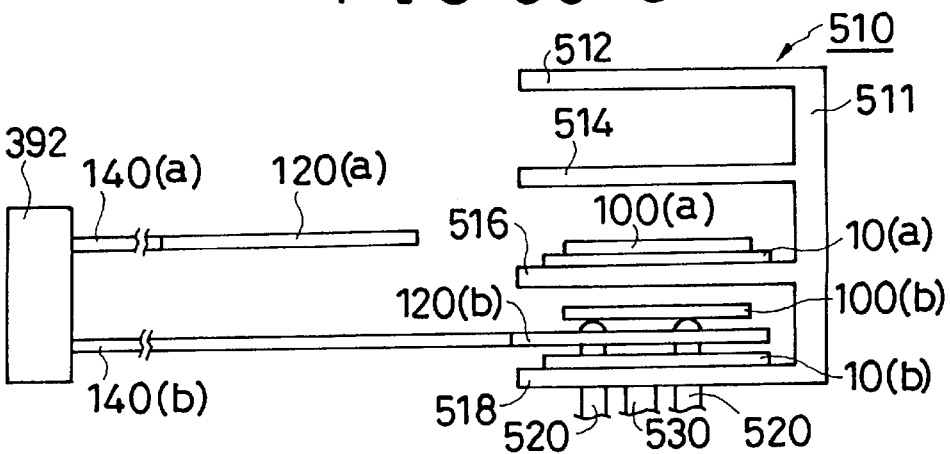

Then, as shown in FIG. 295, the tweezer 120(*a*) is lowered by lowering the transfer robot 392, thereby mounting the semiconductor wafer 100(*a*) on the projection pins 520, Thereafter, as shown in FIG. 29C, the tweezer 120(*a*) is retreated and then, as shown in FIG. 30A, the mounting plates 516 and 518 are lifted to mount the semiconductor wafer 100(*a*) on the wafer holding member 10(*a*), and the projection pins 520 are kept projecting above the wafer holding member 10(*b*).

Thereafter, as shown in FIG. 30B, the tweezer 120(*b*) having the semiconductor wafer 100(*b*) thereon extends above the projection pins 520.

Then, as shown in FIG. 30C, the tweezer 120(*b*) is lowered by lowering the transfer robot 392, thereby mounting the semiconductor wafer 100(*b*) on the projection pins 520.

Figure 31:
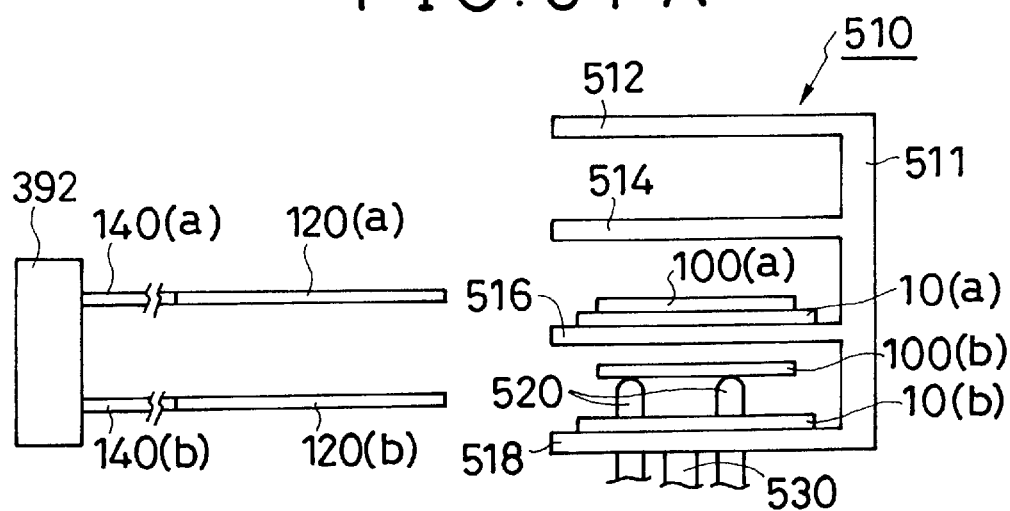
Figure 31:
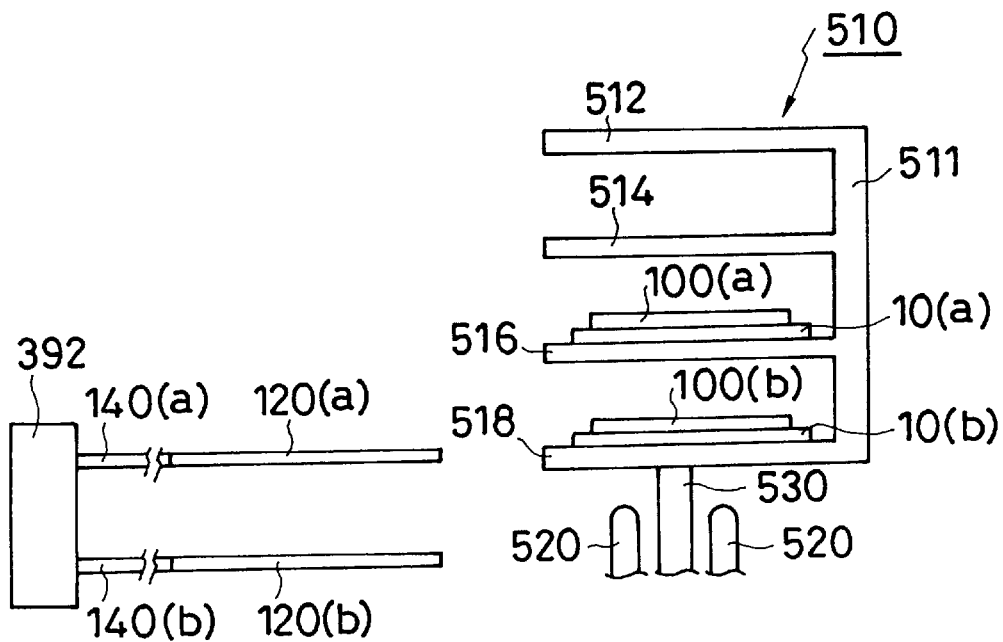

Thereafter, as shown in FIG. 31A, the tweezer 120(*b*) is retreated, and nest, as shown in FIG. 31B, the mounting plates 516 and 518 are lifted to mount the semiconductor wafer 100(*b*) on the wafer holding member 10(*b*). Then, the mounting plates 516 and 518 are further lifted, resulting in a state where the wafer holding member 10(*b*) is held above upper ends of the projection pins 520.

Figure 32:
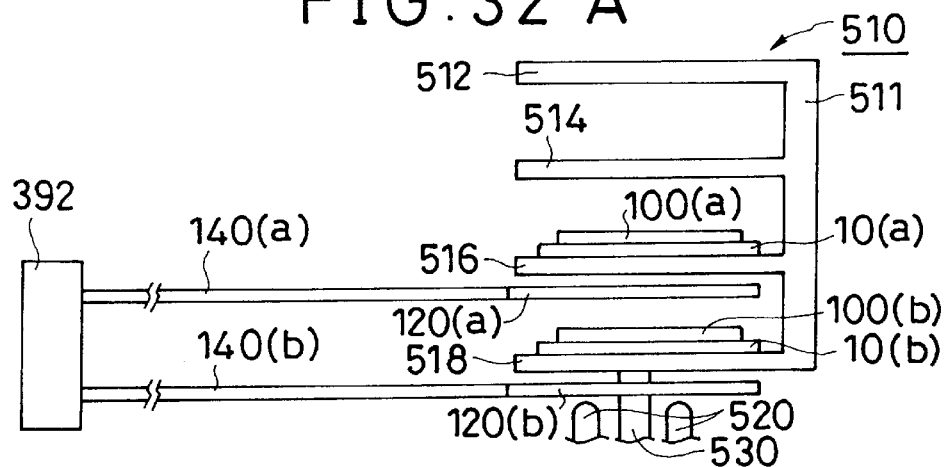
Figure 32:
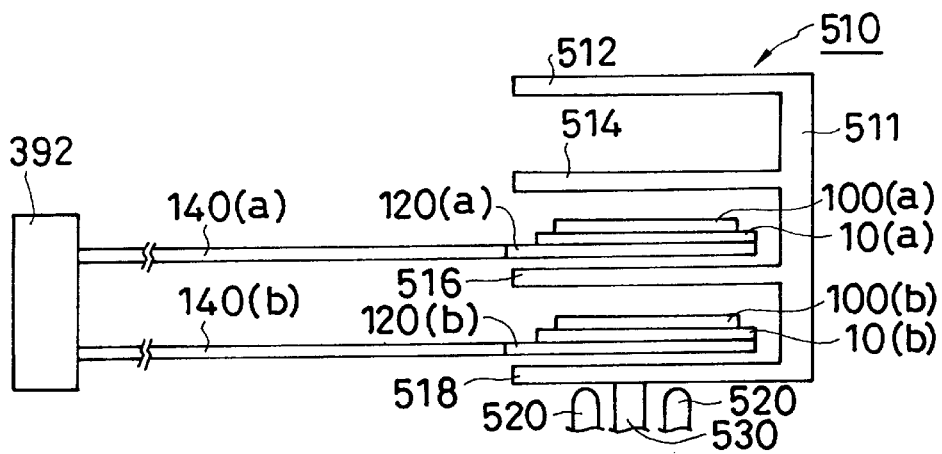
Figure 32:
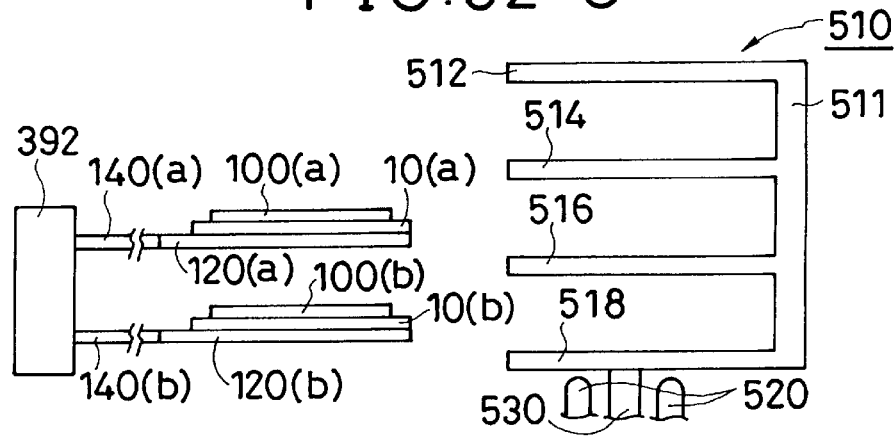

Thereafter, as shown in FIG. 32A, the tweezers 120(*a*) and 120(*b*) are extended simultaneously and inserted below the wafer holding members 10(*a*) and 10(*b*), respectively. Then, as shown in FIG. 32*a* the mounting plates 516 and 518 are lowered, and the wafer holding members 10(*a*) and 10(*b*) respectively having the semiconductor wafers 100(*a*) and 100(*b*) thereon are mounted on the tweezers 120(*a*) and 120(*b*), respectively.

Thereafter, as shown in FIG. 32C, in a state where the wafer holding members 10(*a*) and 10(*b*) are respectively held on the tweezers 120(*a*) and 120(*b*), the arms 140(*a*) and 140(*b*) are contracted.

Then, the arms 140(*a*) and 140(*b*) are rotated toward the processing chamber 386 as shown by the transfer course 502 in FIG. 33. Then, the arms 140(*a*) and 140(*b*) are extended, and the wafer holding members 10(*a*) and 10(*b*) are transferred into the processing chamber 376 which is kept at a predetermined temperature. Thereafter, the tweezers 120(*a*) and 120(*b*) are lowered, and the semiconductor wafers 100(*a*) and 100(*b*) are respectively mounted together with the wafer holding members 10(*a*) and 10(*b*) on the two plates 110(*a*) and 110(*b*) of the processing chamber 376. Then, the arms 140(*a*) and 140(*b*) are contracted, and the tweezers 120(*a*) and 120(*b*) are retreated from the processing chamber 386 while leaving the wafer holding members 10(*a*) and 10(*b*) and the semiconductor wafers 100(*a*) and 100(*b*) on the plates 110(*a*) and 110(*b*), respectively.

In the processing chamber 386, after the processing is conducted for a predetermined time, the semiconductor wafers 100(*a*) and 100(*b*) are transferred to the cassette 410 by reverse procedures.

That is, the tweezers 120(*a*) and 120(*b*) are inserted simultaneously below the wafer holding members 10(*a*) and 10(*b*) mounted on the plates 110(*a*) and 110(*b*) of the processing chamber 386 and then, the tweezer 120(*a*) and 120(*b*) are lifted and the wafer holding members 10(*a*) and 10(*b*) are mounted together with the semiconductor wafer 100(*a*) and 100(*b*) on the tweezer 120(*a*) and 120(*b*), respectively.

Thereafter, the arms 140(*a*) and 140(*b*) are contracted to retreat the tweezers 120(*a*) and 120(*b*) and then, the arms 140(*a*) and 140(*b*) are rotated toward the cooling chamber 384 along the transfer course 503 in FIG. 33, and assume a state as shown in FIG. 32C.

Then, as shown in FIG. 32B, the arms 140(*a*) and 140(*b*) are extended; and in a state where the wafer holding members 10(*a*) and 10(*b*) are respectively held above the projection pin 520, the mounting plates 516 and 518 are lifted to mount the wafer holding members 10(*a*) and 10(*b*) on the mounting plate 516 and 518, respectively and then, the arms 140(*a*) and 140(*b*) are contracted as shown in FIG. 31B.

The semiconductor wafers 100(*a*) and 100(*b*) thus pulled out together with the wafer holding members 10(*a*) and (*b*) from the processing chamber 386 are cooled down to a predetermined temperature together with the wafer holding member 10(*a*) and 10(*b*).

Then, as shown in FIG. 31A, the mounting plate 518 and the wafer holding member 10(*b*) mounted thereon are lowered to place the semiconductor wafer 100(*b*) on the projection pins 520.

Then, as shown in FIG. 30C, the arm 140(*b*) is extended to insert the tweezer 120(*b*) below the semiconductor wafer 100(*b*), and the tweezer 120(*b*) is lifted to mount the semiconductor wafer 100(*b*) directly on the tweezer 120(*b*) as shown in FIG. 30B. Thereafter, as shown in FIG. 30A, the arm 140(*b*) is contracted.

Then, as shown in FIG. 29C, the mounting plate 516 and the wafer holding member 10(*a*) mounted thereon are lowered to place the semiconductor wafer 100(*a*) on the projection pins 520.

Then, as shown in FIG. 29B, the arm 140(*a*) is extended to insert the tweezer 120(*a*) below the semiconductor wafer 100(*a*), and the tweezer 120(*a*) is lifted to mount the semiconductor wafer 100(*a*) directly on the tweezer 120(*b*) as shown in FIG. 29A.

Thereafter, the arm 140(*a*) is contracted, and the arms 140(*a*) and 140(*b*) are rotated toward the cassette chamber 372 as shown by the transfer course 504 in FIG. 33. Then, the arms 140(*a*) and 140(*b*) are extended to mount the semiconductor wafers 100(*a*) and 100(*b*) in the cassette 410.

In the processing chamber 386, the semiconductor wafer 100 is processed in a state where it is mounted on the wafer holding members 10(*a*) and 10(*b*) having the completely ring-like member 590 and therefore, a turbulence of the reaction gas is not produced, and the reaction gas flows uniformly. Thus, the processing quality such as film formation of the semiconductor wafer 100 is stabilized. Further, because the semiconductor wafer 100 is held by the wafer supporting members 592 disposed at equal intervals from one another, it is possible to restrain the deflection due to the semiconductor wafer 100 itself and thus, to restrain a slip phenomenon due to the deflection.

As the wafer holding member 10 of the present twelfth embodiment, the wafer holding member 10 of the first to ninth embodiments can also be used. In such a case also, the semiconductor wafer 100 is processed in a state where it is mounted on the wafer holding members 10(*a*) and 10(*b*), and even after the processing is completed, the wafer holding members 10(*a*) and l(*b*) having the semiconductor wafer 100 thereon are mounted on the tweezers 120(*a*) and 120(*b*) respectively to take out the semiconductor wafer 100, without mounting the high-temperature semiconductor wafer 100 directly on the low-temperature tweezer 120(*a*) and 120(*b*). Therefore, a slip is restrained from being generated.

Further, the semiconductor wafer 100(*a*)(100(*b*)) is cooled together with the wafer holding member 10(*a*)(10(*b*)) in the cooling chamber 384 in a state where the wafer holding member 10(*a*)(10(*b*)) having the semiconductor wafer 100(*a*)(100(*b*)) thereon is mounted on the mounting plate 516(518), it is possible to effectively restrain the slip from being generated in the semiconductor wafer 100(*a*) (100(*b*)) at the time of cooling.

Also, by lowering the mounting plate 516(518), the projection pins 520 pass through the wafer holding member 10(*a*)(10(*b*)) mounted on the mounting plate 516(518), the tip ends of the projection pins 520 protruded above the wafer holding member 10(*a*)(10(*b*)) mounted on the mounting plate 516(518), and a distance greater than the thickness of the tweezer 120(*a*)(120(*b*)) can be formed between the tip ends of the projection pins 520 and the upper portion of the wafer holding member 10(*a*)(10(*b*)). Therefore, it is possible to insert the tweezer 120(*a*)(120(*b*)) between the upper portion of the wafer holding member 10(*a*)(10(*b*)) and the tip ends of the projection pins 520, i.e., the mounting portion of the semiconductor wafer 100(*a*)(100(*b*)) of the projection pins 520. Thus, even if the wafer holding member 10(*a*)(10(*b*)) is ring-like shaped as in the present embodiment and the semiconductor wafer 100(*a*)(100(*b*)) can not directly be transferred between the wafer holding member 10(*a*)(10(*b*)) and the tweezer 120(*a*)(120(*b*)) by inserting the tweezer 120(*a*)(120(*b*)) into the wafer holding member 10(*a*)(10(*b*)), the semiconductor wafer 100(*a*)(100(*b*)) can be mounted on the tip ends of the projection pins 520 by lowering downward the tweezer 120(*a*)(120(*b*)) mounting the semiconductor wafer 100(*a*)(100(*b*)) from above the tip ends of the projection pins 520 and then, by pulling out the tweezer 120(*a*)(120(*b*)) from a space between the tip ends of the projection pins 520 and the upper portion of the wafer holding member 10(*a*)(10(*b*)). Further, the semiconductor wafer 100(*a*)(100(*b*)) can be mounted on the tweezer 120(*a*)(120(*b*)) by previously mounting the semiconductor wafer 100(*a*)(100(*b*)) on the tip ends of the projection pins 520, inserting the tweezer 120(*a*)(120(*b*)) between the tip ends of the projection pins 520 and the upper portion of the wafer holding member 10(*a*)(10(*b*)) and, lifting the tweezer 120(*a*)(120(*b*)) thereafter.

Next, referring to FIG. 33, a transfer procedure and a processing procedure of the semiconductor wafer in the semiconductor wafer processing apparatus of the present embodiment will be described in more detail.

First, the wafer holding member 10 is mounted on each of the mounting plates 512, 514, 516 and 518 of the exchanging member 510 (step S1).

Next, the semiconductor wafer 100 is transferred from the cassette 410 onto the wafer holding member 10 on the mounting plate 516 (step S2). Then, the semiconductor wafer 100 is transferred from the cassette 410 onto the wafer holding member 10 on the mounting plate 518 (step S3) . . . (transfer course 501).

Next, the wafer holding members 10 on the mounting plates 516 and 518 are transferred onto the plates 110(*a*) and 110(*b*) in the processing chamber 386 together with the unprocessed semiconductor wafer 100, and the processing is conducted (step S4) . . . (transfer course 502).

While the processing is conducted in the processing chamber 386, the semiconductor wafer 100 is transferred from the cassette 410 onto the wafer holding member 10 on the mounting plate 512 (step S5). Then, the semiconductor wafer 100 is transferred from the cassette 410 onto the wafer holding member 10 on the mounting plate 514 (step S6) . . . (transfer course 501).

Next, two semiconductor wafers 100' which has been processed are transferred from the processing chamber 386 onto the mounting plates 516 and 518, respectively, in a state where each of the two semiconductor wafers 100' is mounted on the wafer holding member 10 (step S7) . . . (transfer course 503).

Next, the wafer holding members 10,10 on the mounting plates 512 and 514 are transferred onto the plates 110(*a*) and 110(*b*) in the processing chamber 386 together with the unprocessed semiconductor wafer 100, and the processing is conducted (stop S8) . . . (transfer course 502).

While the processing is conducted in the processing chamber 386, the processed semiconductor wafer 100' on the mounting plate 518 is transferred to the cassette 410 in a state where the wafer holding member 10 is left on the mounting plate 518 (step S9). Thereafter, the processed semiconductor wafer 100' is transferred to the cassette 410 in a state where the wafer holding member 10 is left on the mounting plate 516 (step S10) . . . (transfer course 504).

While the processing is conducted in the processing chamber 386, the semiconductor wafer 100 is transferred from the cassette 410 onto the wafer holding member 10 on the mounting plate 516 (step S11). Then, the semiconductor wafer 100 is transferred from the cassette 410 onto the wafer holding member 10 on the mounting plate 518 (stop S12) . . . (transfer course 501).

Next, two semiconductor wafers 100 which has been processed are transferred from the processing chamber 386 onto the mounting plates 512 and 514, respectively, in a state where each of the two semiconductor wafers 100 is mounted on the wafer holding member 10 (step S13) . . . (transfer course 503).

Next, the wafer holding members 10,10 on the mounting plates 516 and 518 are transferred onto the plates 110(*a*) and 110(*b*). in the processing chamber 386 together with the unprocessed semiconductor wafer 100, and the processing is conducted (step S14) . . . (transfer course 502).

While the processing is conducted in the processing chamber 386, the processed semiconductor wafer 100' on the mounting plate 514 is transferred to the cassette 410 in a state where the wafer holding member 10 is left on the mounting plate 514 (step S15). Thereafter, the processed semiconductor wafer 100 is transferred to the cassette 410 in a state where the wafer holding member 10 is left on the mounting plate 512 (step 516) . . . (transfer course 504).

Thereafter, the transfer procedure and the processing procedure of the steps S5 to S16 are repeated a predetermined number of times.

Thirteenth Embodiment

Figure 34:
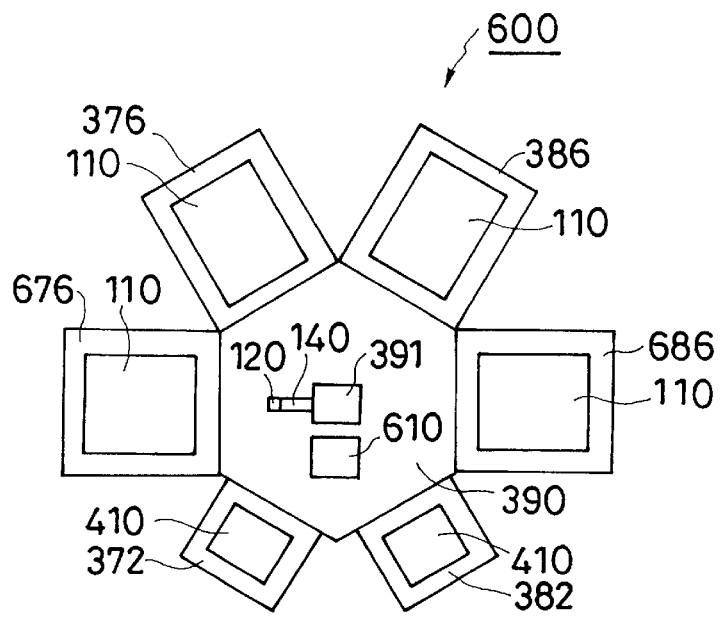
FIG. 34 is a plan view for explaining a semiconductor wafer processing apparatus according to a thirteenth embodiment of the present invention.

In the above described tenth embodiment, the transfer chamber 390 is provided at its side wall with the cooling chambers 374 and 384 which are respectively provided with the exchanging members 360. In the eleventh embodiment, the transfer chamber 390 is provided at its side wall with the cooling chambers 374 and 384 which are respectively provided with the exchanging members 460. In the twelfth embodiment, the transfer chamber 390 is provided at its side wall with the cooling chambers 374 and 384 which are respectively provided with the exchanging members 510. Referring to FIG. 34, the present thirteenth embodiment differs from the tenth to twelfth embodiments in that the transfer chamber 390 of the thirteenth embodiment is provided therein with an exchanging member 610, and the transfer chamber 390 is further provided with processing chambers 676 and 686 instead of cooling chambers which are provided in the tenth to twelfth embodiments. Other structures are the same as those of the tenth to twelfth embodiments.

Any of the exchanging members 360, 430 and 510 of the tenth to twelfth embodiments may be used as the exchanging member 610 of the thirteenth embodiment.

By providing the exchanging member in the transfer chamber 390, a number of processing chambers can be increased (four processing chambers in the thirteenth embodiment). This arrangement is preferably applied to a case where a processing time period is longer than a transferring as a total.

Fourteenth Embodiment

Figure 35:
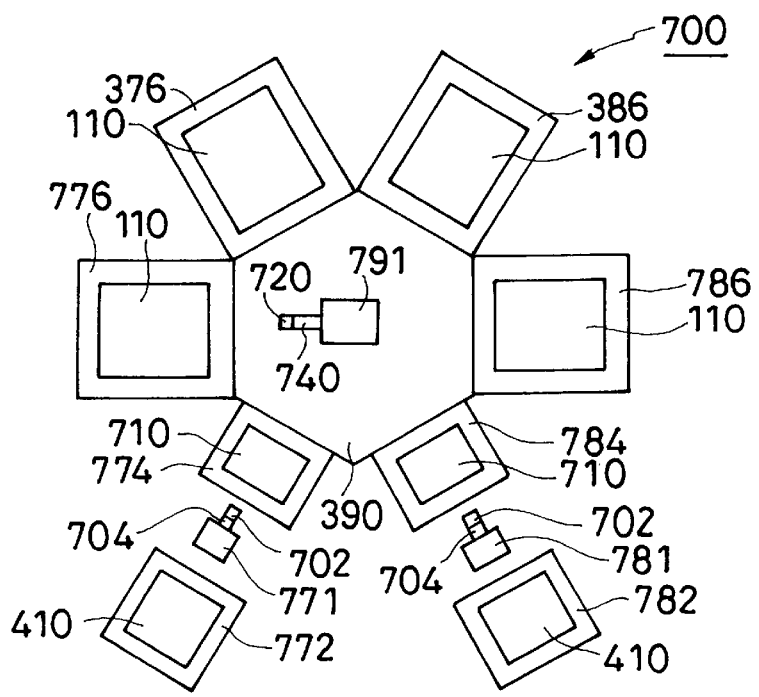
FIG. 35 is a plan view for explaining a semiconductor wafer processing apparatus according to a fourteenth embodiment of the present invention.

In the thirteenth embodiment, the transfer chamber 390 is provided at its side wall with the cassette chambers 372 and 382, and the exchanging member 610 is provided in the transfer chamber 390. In the fourteenth embodiment, as shown in FIG. 35, cassette holding members 772 and 782 for holding the cassette 410 are provided outside the transfer chamber 390, the transfer chamber 390 is provided at its side wall with cooling chambers 774 and 784 instead of the cassette chamber, an exchanging member 710 is provided in each of the cooling chambers 774 and 784, and transfer robot 771 and 781 for transferring wafers are provided between the cassette holding member 772 and the cooling chamber 774, and between the cassette holding member 782 and the cooling chamber 784, respectively. Other structures are the same as those in the thirteenth embodiment.

Any of the exchanging members 360, 430 and 510 of the tenth to twelfth embodiments, respectively, may be used as the exchanging member 710 of the fourteenth embodiment. However, it is necessary that the wafer holding member 10 can be transferred into and out from the side of the transfer chamber 390, and that the semiconductor wafer 100 can be transferred into and out from the sides of the transfer robots 771 and 781. For this purpose, any of the exchanging members 360, 430 and 510 of the tenth to twelfth embodiments, respectively, needs to be arranged such that the exchanging member can be rotated through 180° in a horizontal direction.

Figure 4:
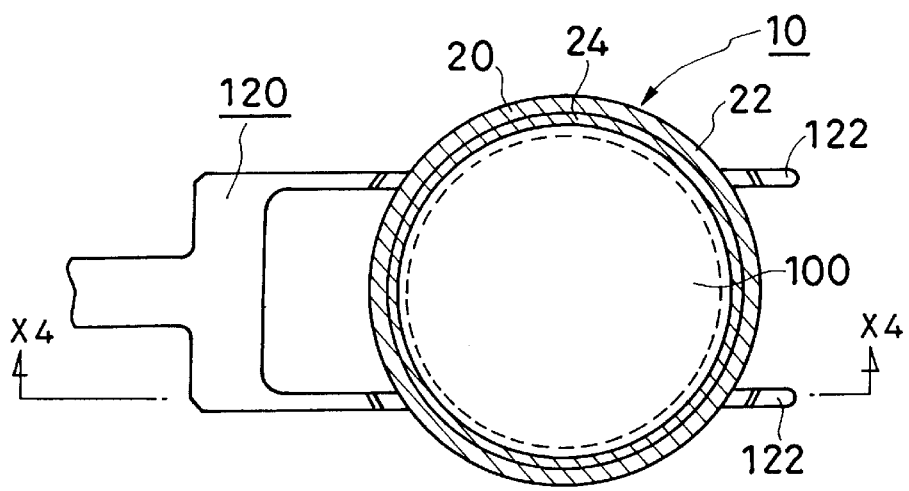
FIG. 4A is a plan view for explaining the semiconductor wafer processing apparatus according to the first embodiment.
FIG. 4B is a sectional view taken along the line X4—X4 in FIG. 4A.
Figure 4:
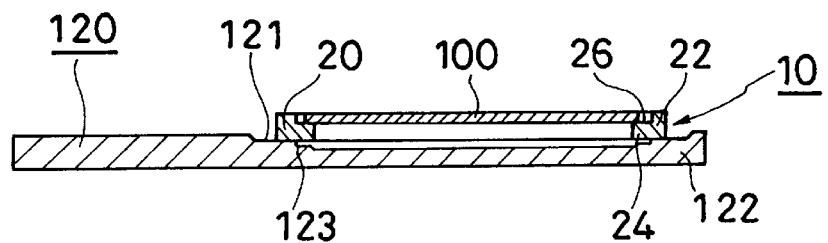

Further, the transfer robot 791 provided in the transfer chamber 390 includes one or more arm 740 and a tweezer 720 provided at a tip end of the arm 740. But the same robot as the transfer robot 391 of the tenth or eleventh embodiment or the transfer robot 392 of the twelfth embodiment may also be used. Each of the tweezer 120 of the above mentioned transfer robot 391 and tweezers 120(a) and 120(b) of the transfer robot 392 includes not only the wafer holding member supporting portion 121 but also the semiconductor wafer supporting portion 123. However, when such a transfer robot is used as the transfer robot 791 of the present fourteenth embodiment, the tweezer including both the wafer holding member supporting portion 121 and the semiconductor wafer supporting portion 123 as shown in FIG. 4, or the tweezer including only the wafer holding member supporting portion 121 may be used.

Each of the transfer robots 771 and 781 includes one or more arm 704 and a tweezer 702 provided at a tip end of the arm 704. But the same robot as the transfer robot 391 of the tenth or eleventh embodiment or the transfer robot 392 of the twelfth embodiment may also be used. Each of the tweezer 120 of the above mentioned transfer robot 391 and tweezers 120(a) and 120(b) of the transfer robot 392 includes not only the wafer holding member supporting portion 121 but also the semiconductor wafer supporting portion 123. However, when such a transfer robot is used as the transfer robot 771 or 781 of the present fourteenth embodiment, the tweezer including both the wafer holding member supporting portion 121 and the semiconductor wafer supporting portion 123 as shown in FIG. 4, or the tweezer including only the wafer holding member supporting portion 123 may be used.

Fifteenth Embodiment

Figure 36:
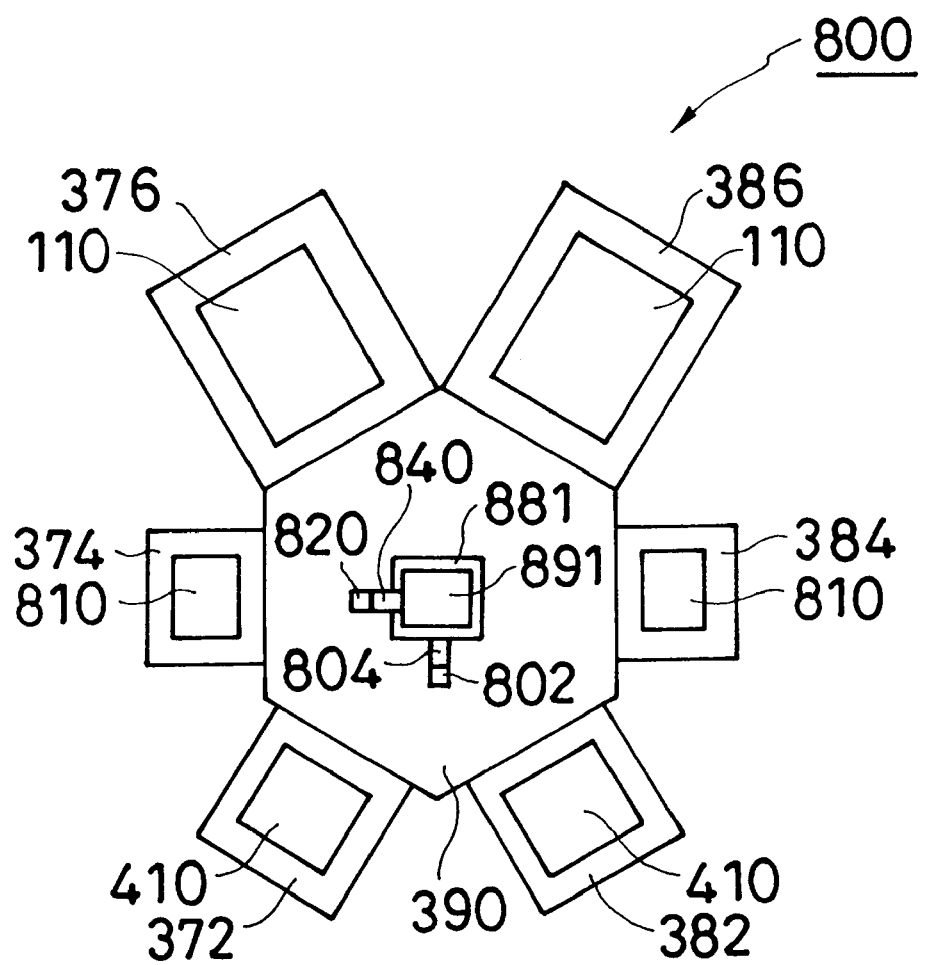
FIG. 36 is a plan view for explaining a semiconductor wafer processing apparatus according to a fifteenth embodiment of the present invention.
Figure 37:
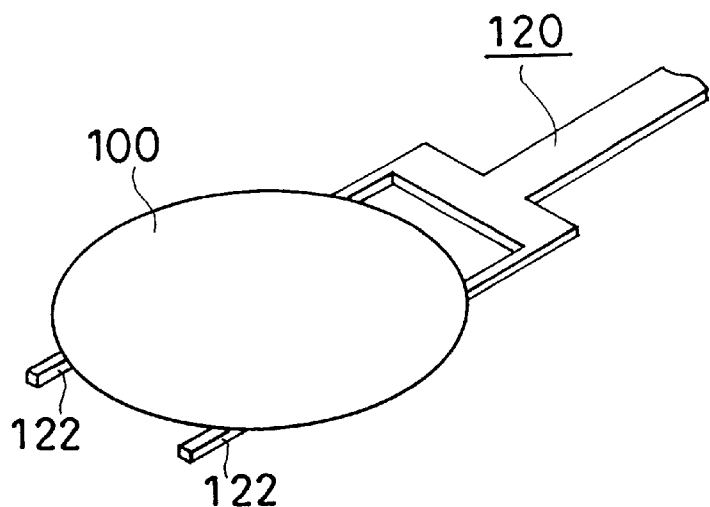
FIGS. 37 and 38 are perspective views for explaining a conventional semiconductor wafer processing apparatus.
Figure 38:
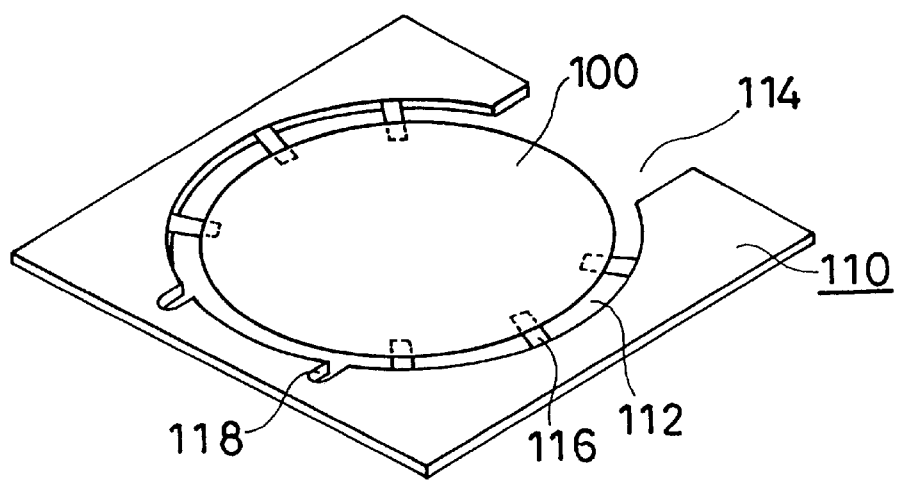
Figure 39:
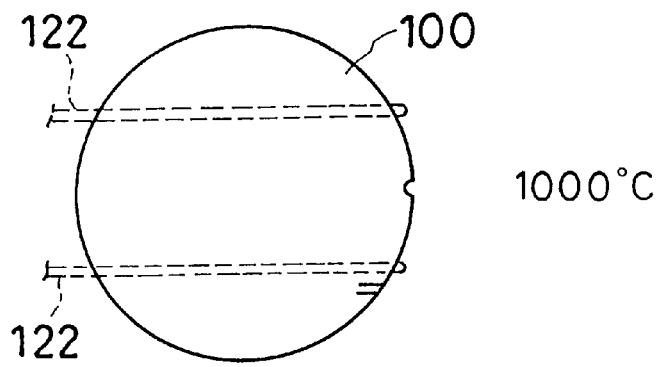
FIGS. 39A, 39B and 39C are plan views each for explaining a state of a semiconductor wafer which is processed by the conventional semiconductor wafer processing apparatus.
Figure 39:
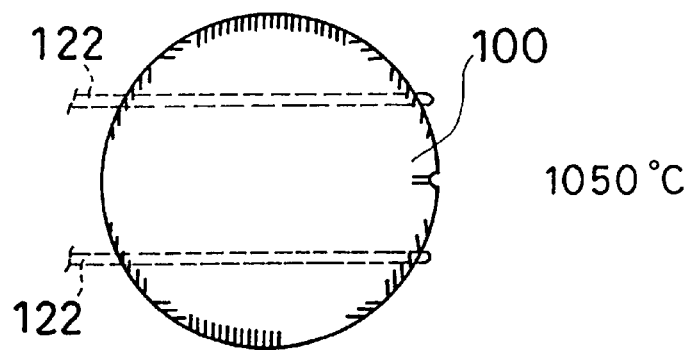
Figure 39:
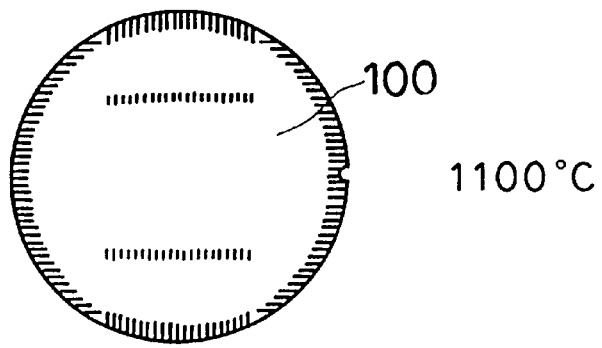

In each of the tenth and eleventh embodiments, the tweezer 120 includes both the wafer holding member supporting portion 121 and the semiconductor wafer supporting portion 123, and the transfer robot 391 has a structure in which both the wafer holding member 10 and the semiconductor wafer 100 can be mounted on the same tweezer 120. In the twelfth embodiment, each of the tweezer 120(a) and 120(b) includes both the wafer holding member supporting portion 121 and the semiconductor wafer supporting portion 123, and the robot 392 has a structure in which both the wafer holding members 10(a) and 10(b) and the semiconductor wafer 100(a) and 100(b) can be mounted on the same tweezer 120(a) and 120(b), respectively. Referring to FIG. 36, the present fifteenth embodiment differs from the tenth to twelfth embodiments in that provided in the transfer chamber 390 are two transfer robots, i.e., a transfer robot 891 for transferring the wafer holding member and including one or more tweezer 820 having the wafer holding member supporting portion and an arm 840 for the tweezer 820, and a transfer robot 881 for transferring the semiconductor wafer and including one or more tweezer 802 having the semiconductor wafer supporting portion and an arm 804 for the tweezer 802. Other structures are the same as those of the tenth to twelfth embodiments. The transfer robots 891 and 881 may be disposed on the same position or different positions as viewed on a plan view.

Any of the exchanging member 360 of the tenth embodiment, the exchanging member 430 of the eleventh embodiment and the exchanging member 510 of the twelfth embodiment can be used as the exchanging member 810 mounted in each of the cooling chambers 374 and 384 of the present fifteenth embodiment.

What is claimed is:

1. A substrate processing apparatus, comprising:

a processing chamber for processing a substrate;

a heater capable of heating an interior of said processing chamber;

the substrate holding member capable of holding the substrate, and allowing the substrate to be processed in the processing chamber in a state where the substrate holding member holds the substrate; and a mechanism, which is capable of allowing the substrate holding member to hold the substrate and then transferring the substrate holding member holding the substrate into said processing chamber, and/or which is capable of carrying out the substrate holding member from said processing chamber in a state where the substrate holding member holds the substrate, and then separating the substrate from the substrate holding member, wherein said mechanism includes a holding member having a first sub holding member capable of holding the substrate and a second sub holding member capable of holding the substrate holding member and a transfer mechanism capable of transferring the substrate holding member between the processing chamber and the holding member.

2. A substrate processing apparatus as recited in claim 1, wherein said mechanism is capable of allowing said substrate holding member to hold said substrate and then transferring said substrate holding member holding said substrate into said processing chamber, and is capable of carrying out said substrate holding member from said processing chamber in a state where said substrate holding member holds said substrate, and then separating said substrate from said substrate holding member.

3. A substrate processing apparatus as recited in claim 1, wherein said processing chamber is a hot-wall type processing chamber.

4. A substrate processing apparatus as recited in claim 1, wherein said substrate is a substrate for producing an electronic component or electronic components.

5. A substrate processing apparatus as recited in claim 4, wherein said substrate is a semiconductor wafer.

6. A substrate processing apparatus as recited in claim 1, further comprising a series of chambers including said processing chamber, said mechanism being provided in said series of chambers.

7. A substrate processing apparatus as recited in claim 1, further comprising a series of chambers including said processing chamber, said holding member being provided in said series of chambers.

8. A substrate processing apparatus as recited in claim 7, wherein said transfer mechanism is provided in said series of chambers.

9. A substrate processing apparatus as recited in claim 1, wherein when said second sub holding member holds said substrate holding member, a height of a substrate holding portion of said first sub holding member is higher than a height of a substrate holding portion of said substrate holding member.

10. A substrate processing apparatus as recited in claim 9, wherein when said first sub holding member holds said substrate and said second sub holding member holds said substrate holding member, a lower portion of said substrate is higher than an upper portion of said substrate holding member.

11. A substrate processing apparatus as recited in claim 9, wherein said substrate holding member includes an opening, and said first sub holding member passes through said opening when said second sub holding member holds said substrate holding member.

12. A substrate processing apparatus as recited in claim 9, further comprising a second transfer mechanism for transferring said substrate, said second transfer mechanism including a substrate mounting member for mounting said substrate, wherein when said first sub holding member holds said substrate, and when said second sub holding member holds said substrate holding member, there exists, between a lower portion of said substrate and an upper portion of said substrate holding member, a distance greater than a thickness of a substrate mounting portion of said substrate mounting member.

13. A substrate processing apparatus as recited in claim 1, wherein said transfer mechanism includes a substrate holding member mounting member capable of mounting said substrate holding member, said substrate holding member mounting member and said holding member being capable of performing a relative movement in a vertical direction with respect to each other.

14. A substrate processing apparatus as recited in claim 13, wherein said substrate, holding member mounting member mounting said substrate holding member holding said substrate is capable of being relatively moved downward with respect to said holding member so that a substrate holding member holding portion of said substrate holding member mounting member comes lower than a substrate holding member holding portion of said second sub holding member, thereby holding said substrate on said first sub holding member and holding said substrate holding member on said second sub holding member, and/or wherein said substrate holding member mounting member is capable of being relatively moved upward with respect to said holding member, with said substrate being held in advance on said first sub holding member, and with said substrate holding member being held in advance on said second sub holding member, so that said substrate holding member is mounted on said substrate holding member mounting member and a substrate holding portion of said substrate holding member comes higher than a substrate holding portion of said first sub holding member, thereby mounting said substrate on said substrate holding member.

15. A substrate processing apparatus as recited in claim 1, wherein said first and second sub holding members are capable of performing a relative movement in a vertical direction with respect to each other, and a height of a substrate holding portion of said first sub holding member and a height of a substrate holding member holding portion of said second sub holding member can be made different from each other.

16. A substrate processing apparatus as recited in claim 15, wherein when said substrate holding member is held on said second sub holding member, a height of said substrate holding portion of said first sub holding member can be made higher than a height of a substrate holding portion of said substrate holding member by relatively moving said first sub holding member upward with respect to said second sub holding member, and wherein when said substrate holding member is held on said second sub holding member, a height of said substrate holding portion of said first sub holding member can be made lower than a height of said substrate holding portion of said substrate holding member by relatively moving said first sub holding member downward with respect to said second sub holding member.

17. A substrate processing apparatus as recited in claim 15, wherein when said first sub holding member holds said substrate and said second sub holding member holds said substrate holding member, a lower portion of said substrate can be made higher than an upper portion of said substrate holding member by relatively moving said first sub holding member upward with respect to said second sub holding member.

18. A substrate processing apparatus as recited in claim 15, wherein said substrate holding member includes an opening, said first sub holding member being capable of passing through said opening.

19. A substrate processing apparatus as recited in claim 15, wherein said transfer mechanism includes a substrate holding member mounting member capable of mounting said substrate holding member, said substrate holding member mounting member and said second sub holding member being capable of performing a relative movement in a vertical direction with respect to each other.

20. A substrate processing apparatus as recited in claim 19, wherein said substrate holding member mounting member mounting said substrate holding member is capable of being relatively moved downward with respect to said second sub holding member so that a substrate holding member holding portion of said substrate holding member mounting member comes lower than a substrate holding member holding portion of said second sub holding member, thereby holding said substrate holding member on said second sub holding member, and/or wherein said substrate holding member mounting member is capable of being relatively moved upward with respect to said second sub holding member, with said substrate holding member being held in advance on said second sub holding member, so that said substrate holding member holding portion of said substrate holding member mounting member becomes higher than said substrate holding member holding portion of said second sub holding member, thereby mounting said substrate holding member on said substrate holding member mounting member.

21. A substrate processing apparatus as recited in claim 15, further comprising a second transfer, mechanism for transferring said substrate, said second transfer mechanism including a substrate mounting member for mounting said substrate, wherein when said first sub holding member holds said substrate and said second sub holding member holds said substrate holding member by relatively moving said first sub holding member upward with respect to said second sub holding member, there exists, between a lower portion of said substrate and an upper portion of said substrate holding member, a distance greater than a thickness of a substrate mounting portion of said substrate mounting member.

22. A substrate processing apparatus as recited in claim 1, further comprising a second transfer mechanism for transferring said substrate, said second transfer mechanism including a substrate mounting member for mounting said substrate.

23. A substrate processing apparatus as recited in claim 22, further comprising a series of chambers including said processing chamber, said second transfer mechanism being provided in said series of chambers.

24. A substrate processing apparatus as recited in claim 22, wherein said transfer mechanism and said second transfer mechanism are integrated, said transfer mechanism including a substrate holding member mounting member capable of mounting said substrate holding member, said substrate holding member mounting member also serving as said substrate mounting member.

25. A substrate processing apparatus as recited in claim 1, further comprising a transfer chamber, said processing chamber being capable of communicating with said transfer chamber, said transfer mechanism being provided in said transfer chamber.

26. A substrate processing apparatus as recited in claim 25, further comprising an auxiliary chamber in which said holding member is provided.

27. A substrate processing apparatus as recited in claim 25, wherein said holding member is provided in said transfer chamber.

28. A substrate processing apparatus as recited in claim 25, further comprising a cassette chamber and a second transfer mechanism, wherein said cassette chamber is capable of communicating with said transfer chamber, and a cassette capable of mounting a plurality of said substrates can be mounted in said cassette chamber, said second transfer mechanism being capable of transferring said substrate between said cassette in said cassette chamber and said holding member.

29. A substrate processing apparatus as recited in claim 28, wherein said second transfer mechanism is provided in said transfer chamber.

30. A substrate processing apparatus as recited in claim 1, wherein said substrate is a semiconductor wafer, said substrate holding member is provided at its inside with a space which is substantially circular as viewed from above, said substantially circular space having a size greater than said semiconductor wafer or a size in which only an outer peripheral portion of said semiconductor wafer is superposed on said holding member as viewed from above.

31. A substrate processing apparatus as recited in claim 30, wherein said substrate holding member is a ring-like member supporting the outer peripheral portion of said semiconductor wafer.

32. A substrate processing apparatus as recited in claim 1, wherein said substrate is a semiconductor wafer, said substrate holding member includes a ring-like member and at least three wafer supporting members, an inner diameter of said ring-like member is greater than an outer diameter of said semiconductor wafer, and said wafer supporting members are provided in an inner space of said ring-like member at substantially equal intervals from one another, each of said wafer supporting members having a supporting portion for supporting said semiconductor wafer.

33. A substrate processing apparatus as recited in claim 32, wherein said wafer supporting portions are designed to support the outer peripheral portion of said semiconductor wafer at substantially equal intervals.

34. A substrate processing apparatus as recited in claim 32, wherein said wafer supporting portions are designed to support said semiconductor wafer at inside thereof with substantially equal loads.

35. A substrate processing apparatus as recited in claim 32, wherein said wafer supporting portions are disposed, at substantially equal intervals from one another, on a circle which is substantially concentric to said semiconductor wafer and has a diameter which is 73% to 85% of a diameter of said semiconductor wafer.

36. A substrate processing apparatus, comprising:
  a hot-wall type processing chamber for processing a substrate;
  a heater capable of heating an interior of said processing chamber;
  a substrate holding member capable of holding the substrate, and allowing the substrate to be processed in the processing chamber in a state where the substrate holding member holds the substrate; and
  a mechanism, which is capable of transferring the substrate holding member, in a state where the substrate holding member holds the substrate, into the processing chamber which is heated, and/or which is capable of carrying out the substrate holding member, state where the substrate holding member holds the substrate, from the heated processing chamber,
  wherein said mechanism includes a holding member having a first sub holding member capable of holding the substrate and a second sub holding member capable of holding the substrate holding member and a transfer mechanism capable of transferring the substrate holding member between the processing chamber and the holding member.

37. A substrate processing apparatus as recited in claim 36, wherein said substrate is a substrate for producing an electronic component or electronic components.

38. A substrate processing apparatus as recited in claim 37, wherein said substrate is a semiconductor wafer.

39. A substrate processing apparatus as recited in claim 38, wherein said substrate holding member is provided at its inside with a space which is substantially circular as viewed from above, said substantially circular space having a size greater than said semiconductor wafer or a size in which only an outer peripheral portion of said semiconductor wafer is superposed on said holding member as viewed from above.

40. A substrate processing apparatus as recited in claim 39, wherein said substrate holding member is a ring-like member supporting the outer peripheral portion of said semiconductor wafer.

41. A substrate processing apparatus as recited in claim 40, wherein said semiconductor wafer is a silicon wafer having a diameter of about 8 inches, and said ring-like member has a heat capacity in a range from about 18 kJ to about 48 kJ.

42. A substrate processing apparatus as recited in claim 40, wherein said semiconductor wafer is a silicon wafer having a diameter of about 12 inches, and said ring-like member has a heat capacity in a range from about 80 kJ to about 200 kJ.

43. A substrate processing apparatus as recited in claim 38, wherein said substrate holding member includes a ring-like member and at least three wafer supporting members, an inner diameter of said ring-like member is greater than an outer diameter of said semiconductor wafer, said wafer supporting members are provided in an inner space of said ring-like member at substantially equal intervals from one another, each of said wafer supporting members having a supporting portion for supporting said semiconductor wafer.

44. A substrate processing apparatus as recited in claim 43, wherein said wafer supporting portions are designed to support the outer peripheral portion of said semiconductor wafer at substantially equal intervals.

45. A substrate processing apparatus as recited in claim 43, wherein said wafer supporting portions are designed to support said semiconductor wafer at inside thereof with substantially equal loads.

46. A substrate processing apparatus as recited in claim 43, wherein said wafer supporting portions are disposed, at substantially equal intervals from one another, on a circle which is substantially concentric to said semiconductor wafer and has a diameter which is 73% to 85% of a diameter of said semiconductor wafer.

47. A substrate processing method using a substrate processing apparatus that includes a hot-wall type processing chamber for processing a substrate, a substrate holding member for holding the substrate, and a mechanism, which allows the substrate holding member to hold the substrate and then transfer the substrate holding member holding the substrate into the hot-wall type processing chamber, and/or which is capable of carrying out the substrate holding member from the hot-wall type processing chamber in a state where the substrate holding member holds the substrate, and separating the substrate from the substrate holding member, wherein the mechanism includes a holding member having a first sub holding member capable of holding the substrate and a second sub holding member capable of holding the substrate holding member and a transfer mechanism capable of transferring the substrate holding, member between the hot-wall type processing chamber and the holding member, comprising the steps of:

transferring the substrate holding member holding the substrate into the hot-wall type processing chamber which is kept at a predetermined temperature;

processing the substrate in a state where the substrate is held by the substrate holding member in the hot-wall type processing chamber; and carrying out the substrate holding member holding the substrate from the hot-wall type processing chamber.

48. A substrate processing method as recited in claim 47, wherein said substrate is a substrate for producing an electronic component or electronic components.

49. A substrate processing method as recited in claim 48, wherein said substrate is a semiconductor wafer.

50. A substrate processing method as recited in claim 47, wherein said step for transferring said substrate holding member holding said substrate into said processing chamber is a step for transferring said substrate holding member holding said substrate in a state where said substrate holding member is held by a first substrate holding member mounting portion of a first transfer mechanism, and said step for carrying out said substrate holding member holding said substrate from said processing chamber is a step for carrying out said substrate holding member holding said substrate from said processing chamber in a state where said substrate holding member is hold by a second substrate holding member mounting portion of a second transfer mechanism.

51. A substrate processing method as recited in claim 50, wherein said first transfer mechanism and said second transfer mechanism are the same, and said first substrate holding member mounting portion and said second substrate holding member mounting portion are the same.

52. A substrate processing method as recited in claim 47, further comprising the steps of:

cooling said substrate in a state where said substrate is held by said substrate holding member after the substrate is carried out from said processing chamber; and then, unloading said substrate from said substrate holding member.

53. A substrate processing method as recited in claim 47, further comprising the steps of:

transferring said substrate from said substrate holding member onto supporting members which support said substrate at equal intervals, after said substrate is carried out from said processing chamber;

then, cooling said substrate in a state where said substrate is held on said supporting members; and then, unloading said substrate from said supporting members.

54. A substrate method as recited in claim 47, further comprising a step for holding said substrate by said substrate holding member, which step is conducted in an apparatus including said processing chamber and before said step for transferring said substrate holding member holding said substrate into said processing chamber.

55. A substrate processing method as recited in claim 47, further comprising a step for holding said substrate by said substrate holding member and thereafter transferring said substrate into said processing chamber when a signal indicating that said substrate holding member is in use is input from outside, and transferring only said substrate into said processing chamber when a signal indicating that said substrate holding member is not in use is input from outside.

56. A substrate processing method using a substrate processing apparatus including a processing chamber for processing a substrate, a substrate holder for holding the substrate, and a mechanism which allows the substrate holder to hold the substrate and then transfer the substrate holder holding the substrate into the processing chamber, and/or which is capable of carrying out the substrate holder from the processing chamber in a state where the substrate holder holds the substrate, and then separating the substrate from the substrate holder, wherein the mechanism includes a holding member having a first sub holding.

57. A substrate processing method as recited in claim 56, wherein said substrate is a semiconductor wafer, and said substrate holder is a ring-like member supporting an outer peripheral portion of said semiconductor wafer, said substrate holder being provided at its inside with a space which is substantially circular as viewed from above, said substantially circular space having a size in which only the outer peripheral portion of said semiconductor wafer is superposed on said holder as viewed from above.

58. A substrate processing method as recited in claim 56, wherein said substrate is a semiconductor wafer, said substrate holder includes a ring-like member and at least three wafer supporting members, an inner diameter of said ring-like member is greater than an outer diameter of said semiconductor wafer, and said wafer supporting members are provided in an inner space of said ring-like member at substantially equal intervals from one another, each of said wafer supporting members having a supporting portion for supporting said semiconductor wafer.

\* \* \* \* \*